(12) United States Patent
Kumaki et al.

(10) Patent No.: US 8,643,003 B2
(45) Date of Patent: Feb. 4, 2014

(54) LIGHT EMITTING DEVICE

(75) Inventors: Daisuke Kumaki, Nigata (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 157 days.

(21) Appl. No.: 13/219,880

(22) Filed: Aug. 29, 2011

(65) Prior Publication Data

US 2011/0309351 A1    Dec. 22, 2011

Related U.S. Application Data

(62) Division of application No. 10/582,718, filed as application No. PCT/JP2005/017076 on Sep. 9, 2005, now Pat. No. 8,008,652.

(30) Foreign Application Priority Data

Sep. 24, 2004   (JP) ................................. 2004-278259

(51) Int. Cl.
   *H01L 29/08*   (2006.01)
   *H01L 35/24*   (2006.01)
   *H01L 51/00*   (2006.01)

(52) U.S. Cl.
   USPC ........................ 257/40; 257/79; 257/E33.016

(58) Field of Classification Search
   USPC ...................................... 257/40, 79, E33.016
   See application file for complete search history.

(56) References Cited

U.S. PATENT DOCUMENTS

| | | | |
|---|---|---|---|
| 5,404,075 A | 4/1995 | Fujikawa et al. | |
| 5,457,565 A | 10/1995 | Namiki et al. | |
| 5,757,026 A | 5/1998 | Forrest et al. | |
| 5,853,905 A | 12/1998 | So et al. | |
| 5,886,365 A | 3/1999 | Kouchi et al. | |
| 5,925,980 A | 7/1999 | So et al. | |
| 5,989,737 A | 11/1999 | Xie et al. | |

(Continued)

FOREIGN PATENT DOCUMENTS

| | | |
|---|---|---|
| CN | 1422104 A | 6/2003 |
| EP | 0 855 848 A2 | 7/1998 |

(Continued)

OTHER PUBLICATIONS

Office Action re EP application No. EP 05 783 151.3, dated Mar. 7, 2012.

(Continued)

*Primary Examiner* — Phat X Cao
(74) *Attorney, Agent, or Firm* — Husch Blackwell LLP

(57) ABSTRACT

An object of the present invention is to provide a light emitting element or a light emitting device that can be formed without any regard for a work function of an electrode. Another object of the invention is to provide a light emitting element or a light emitting device in that the range of choice for a material of an electrode can be widened. In an aspect of the invention, a light emitting device includes first, second and third layers between mutually-facing first and second electrodes. The first layer has a donor level. The second layer is a single layer or a laminated body containing a light emitting substance. The third layer has an acceptor level. When a potential of the second electrode is set higher than that of the first electrode, holes generated in the second layer are injected in the third layer.

22 Claims, 20 Drawing Sheets

(56) References Cited

U.S. PATENT DOCUMENTS

| | | | |
|---|---|---|---|
| 5,994,836 A | 11/1999 | Boer et al. | |
| 6,013,384 A | 1/2000 | Kido et al. | |
| 6,130,001 A | 10/2000 | Shi et al. | |
| 6,316,874 B1 | 11/2001 | Arai et al. | |
| 6,323,515 B1 | 11/2001 | Yamazaki et al. | |
| 6,366,017 B1 | 4/2002 | Antoniadis et al. | |
| 6,380,687 B1 | 4/2002 | Yamazaki | |
| 6,423,429 B2 | 7/2002 | Kido et al. | |
| 6,483,236 B1 | 11/2002 | Hung | |
| 6,486,601 B1 | 11/2002 | Sakai et al. | |
| 6,489,638 B2 | 12/2002 | Seo et al. | |
| 6,518,700 B1 | 2/2003 | Friend et al. | |
| 6,521,359 B1 | 2/2003 | Noguchi et al. | |
| 6,525,466 B1 | 2/2003 | Jabbour et al. | |
| 6,552,496 B2 | 4/2003 | Yamazaki | |
| 6,566,807 B1 | 5/2003 | Fujita et al. | |
| 6,573,650 B2 | 6/2003 | Aoki et al. | |
| 6,579,629 B1 | 6/2003 | Raychaudhuri et al. | |
| 6,589,673 B1 | 7/2003 | Kido et al. | |
| 6,593,691 B2 | 7/2003 | Nishi et al. | |
| 6,602,619 B2 | 8/2003 | Lin et al. | |
| 6,608,449 B2 | 8/2003 | Fukunaga | |
| 6,611,108 B2 | 8/2003 | Kimura | |
| 6,639,357 B1 | 10/2003 | Parthasarathy et al. | |
| 6,642,544 B1 | 11/2003 | Hamada et al. | |
| 6,650,047 B2 | 11/2003 | Aoki et al. | |
| 6,670,637 B2 | 12/2003 | Yamazaki et al. | |
| 6,674,136 B1 | 1/2004 | Ohtani | |
| 6,677,613 B1 | 1/2004 | Yamazaki et al. | |
| 6,689,492 B1 | 2/2004 | Yamazaki et al. | |
| 6,690,033 B2 | 2/2004 | Yamazaki et al. | |
| 6,692,845 B2 | 2/2004 | Maruyama et al. | |
| 6,717,358 B1 | 4/2004 | Liao et al. | |
| 6,730,966 B2 | 5/2004 | Koyama | |
| 6,738,034 B2 | 5/2004 | Kaneko et al. | |
| 6,774,573 B2 | 8/2004 | Yamazaki | |
| 6,794,278 B2 | 9/2004 | Kido et al. | |
| 6,806,640 B2 | 10/2004 | Okada et al. | |
| 6,830,494 B1 | 12/2004 | Yamazaki et al. | |
| 6,831,408 B2 | 12/2004 | Hirano et al. | |
| 6,869,635 B2 | 3/2005 | Kobayashi | |
| 6,872,472 B2 | 3/2005 | Liao et al. | |
| 6,905,788 B2 | 6/2005 | Tyan et al. | |
| 6,917,159 B2 | 7/2005 | Tyan et al. | |
| 6,942,534 B2 | 9/2005 | Shibasaki et al. | |
| 6,946,319 B2 | 9/2005 | Stegamat et al. | |
| 6,956,240 B2 | 10/2005 | Yamazaki et al. | |
| 6,982,179 B2 | 1/2006 | Kwong et al. | |
| 7,074,500 B2 | 7/2006 | Pfeiffer et al. | |
| 7,109,956 B2 | 9/2006 | Fery et al. | |
| 7,141,817 B2 * | 11/2006 | Nishi et al. | 257/40 |
| 7,158,161 B2 | 1/2007 | Gyoutoku et al. | |
| 7,256,422 B2 | 8/2007 | Yamazaki | |
| 7,323,225 B2 | 1/2008 | Aoki et al. | |
| 7,365,360 B2 | 4/2008 | Kang et al. | |
| 7,372,076 B2 | 5/2008 | Nishi et al. | |
| 7,548,027 B2 | 6/2009 | Yamazaki | |
| 7,745,991 B2 | 6/2010 | Yamazaki et al. | |
| 7,821,001 B2 | 10/2010 | Kang et al. | |
| 7,868,324 B2 | 1/2011 | Nishi et al. | |
| 8,338,824 B2 | 12/2012 | Nishi et al. | |
| 2001/0046611 A1 | 11/2001 | Kido et al. | |
| 2001/0053559 A1 | 12/2001 | Nagao et al. | |
| 2002/0030443 A1 | 3/2002 | Konuma et al. | |
| 2003/0080338 A1 | 5/2003 | Yamazaki et al. | |
| 2003/0111666 A1 | 6/2003 | Nishi et al. | |
| 2003/0170491 A1 | 9/2003 | Liao et al. | |
| 2003/0189401 A1 | 10/2003 | Kido et al. | |
| 2004/0089870 A1 | 5/2004 | Fery et al. | |
| 2004/0140758 A1 | 7/2004 | Raychaudhuri et al. | |
| 2004/0161192 A1 | 8/2004 | Hamano et al. | |
| 2004/0185299 A1 | 9/2004 | Ly | |
| 2005/0029933 A1 | 2/2005 | Liao et al. | |
| 2005/0035708 A1 | 2/2005 | Yamazaki et al. | |
| 2005/0067951 A1 | 3/2005 | Richter et al. | |
| 2005/0084712 A1 | 4/2005 | Kido et al. | |
| 2005/0084713 A1 | 4/2005 | Kido et al. | |
| 2005/0098207 A1 | 5/2005 | Matsumoto et al. | |
| 2005/0106419 A1 | 5/2005 | Endoh et al. | |
| 2005/0170208 A1 | 8/2005 | Yatsunami et al. | |
| 2005/0236973 A1 | 10/2005 | Leo et al. | |
| 2005/0248267 A1 | 11/2005 | Gyoutoku et al. | |
| 2006/0008740 A1 | 1/2006 | Kido et al. | |
| 2006/0027830 A1 | 2/2006 | Kumaki et al. | |
| 2007/0042221 A1 | 2/2007 | Kawamura | |
| 2007/0114527 A1 | 5/2007 | Kumaki et al. | |
| 2007/0200125 A1 | 8/2007 | Ikeda et al. | |
| 2007/0221912 A1 | 9/2007 | Jeong et al. | |
| 2008/0203385 A1 | 8/2008 | Saito et al. | |
| 2013/0105830 A1 | 5/2013 | Nishi et al. | |

FOREIGN PATENT DOCUMENTS

| | | |
|---|---|---|
| EP | 0 948 063 A2 | 10/1999 |
| EP | 1 009 198 A1 | 6/2000 |
| EP | 1 065 723 A2 | 1/2001 |
| EP | 1 089 361 A2 | 4/2001 |
| EP | 1 093 167 A2 | 4/2001 |
| EP | 1 128 438 A1 | 8/2001 |
| EP | 1 160 891 A2 | 12/2001 |
| EP | 1 179 862 A2 | 2/2002 |
| EP | 1 261 042 A1 | 11/2002 |
| EP | 1 339 112 A2 | 8/2003 |
| EP | 1 351 558 A1 | 10/2003 |
| EP | 1 408 563 A2 | 4/2004 |
| EP | 1 418 567 A1 | 5/2004 |
| EP | 1 524 706 A2 | 4/2005 |
| EP | 1 524 707 A2 | 4/2005 |
| EP | 1 530 245 A2 | 5/2005 |
| JP | 1-312873 | 12/1989 |
| JP | 2-139892 | 5/1990 |
| JP | 2-288092 | 11/1990 |
| JP | 3-114197 | 5/1991 |
| JP | 3-190088 | 8/1991 |
| JP | 3-274695 | 12/1991 |
| JP | 4-297076 | 10/1992 |
| JP | 4-357694 | 12/1992 |
| JP | 6-89040 | 3/1994 |
| JP | 6-267658 | 9/1994 |
| JP | 6-290873 | 10/1994 |
| JP | 6-312979 | 11/1994 |
| JP | 6-346049 | 12/1994 |
| JP | 7-312289 | 11/1995 |
| JP | 9-63771 | 3/1997 |
| JP | 10-270171 | 10/1998 |
| JP | 10-308284 | 11/1998 |
| JP | 2824411 | 11/1998 |
| JP | 11-251067 | 9/1999 |
| JP | 11-297474 | 10/1999 |
| JP | 11-307259 | 11/1999 |
| JP | 11-307264 | 11/1999 |
| JP | 2000-223276 | 8/2000 |
| JP | 2000-315580 | 11/2000 |
| JP | 2000-315581 | 11/2000 |
| JP | 2002-359086 | 12/2002 |
| JP | 2002-367784 | 12/2002 |
| JP | 2003-229278 | 8/2003 |
| JP | 2004-26732 | 1/2004 |
| JP | 2004-39617 | 2/2004 |
| JP | 2004-323509 | 11/2004 |
| JP | 2005-26121 | 1/2005 |
| JP | 2005-32618 | 2/2005 |
| JP | 2005-166637 | 6/2005 |
| JP | 2005-251587 | 9/2005 |
| JP | 2007-533073 | 11/2007 |
| WO | WO 00/01203 A1 | 1/2000 |
| WO | WO 01/15244 A1 | 3/2001 |
| WO | WO 02/41414 A1 | 5/2002 |
| WO | WO 2004/057686 A2 | 7/2004 |

(56) References Cited

FOREIGN PATENT DOCUMENTS

| WO | WO 2005/006460 A1 | 1/2005 |
| WO | WO 2005/109542 A1 | 11/2005 |
| WO | WO 2006/075822 A1 | 7/2006 |

OTHER PUBLICATIONS

Tang, C.W. et al, "Organic Electroluminescent Diodes," Appl. Phys. Lett., vol. 51, No. 12, Sep. 21, 1987, pp. 913-915.

Tokito, S. et al., "Metal Oxides as a Hole-Injecting Layer for an Organic Electroluminescent Device," Journal of Physics D: Applied Physics, vol. 29, 1996, pp. 2750-2753.

Nakada, T. et al., "27a-ZL-12 Multi Photon Emission Organic EL Devices Using Charge-Transfer Complex as Charge Generation Layer," 63RD Applied Physics-Related Combined Seminar, Seminar Proceedings, Sep. 24, 2002, p. 1165 (with English translation).

International Search Report re application No. PCT/JP2005/017076, dated Nov. 15, 2005.

Written Opinion re application No. PCT/JP2005/017076, dated Nov. 15, 2005.

Noh, J.K. et al, "17.1: Invited Paper: Inverted OLED," SID Digest '08: SID International Symposium Digest of Technical Papers, vol. 39, 2008, pp. 212-214.

Office Action re Chinese application No. CN 200580032194.2, dated Oct. 10, 2008 (with English translation).

European Search Report re application No. EP 05783151.3, dated Mar. 15, 2011.

\* cited by examiner

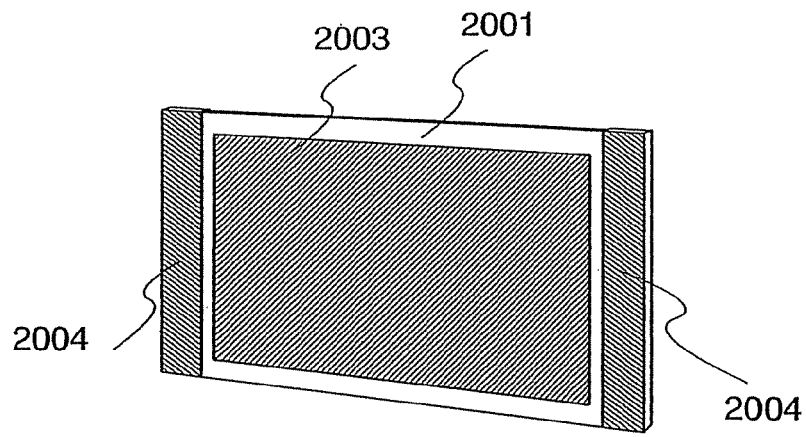
FIG. 8A
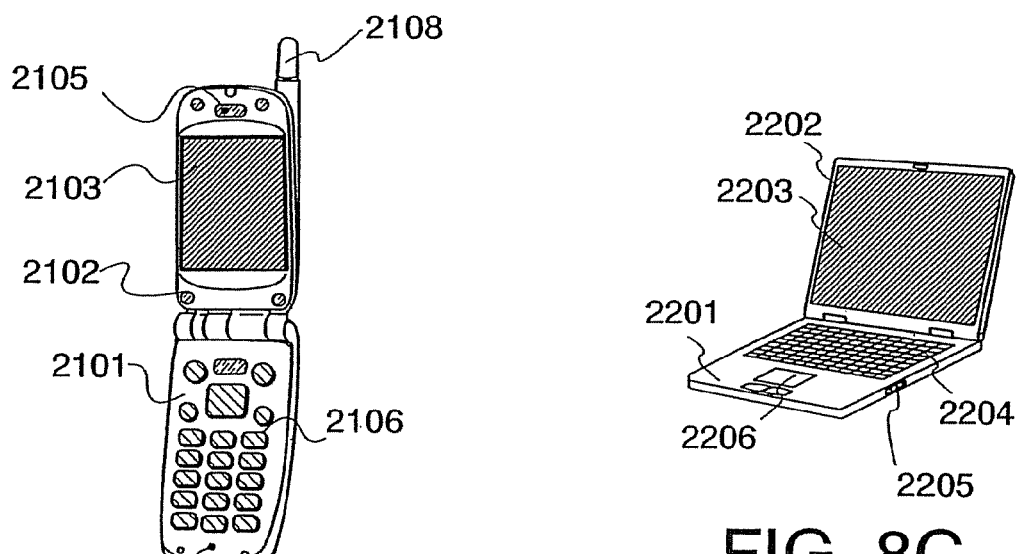
FIG. 8B
FIG. 8C
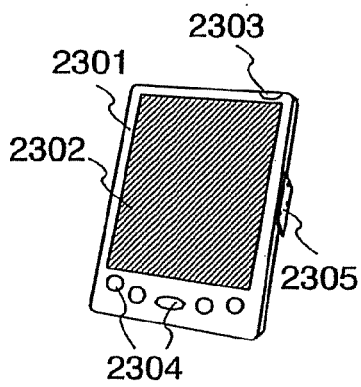
FIG. 8D
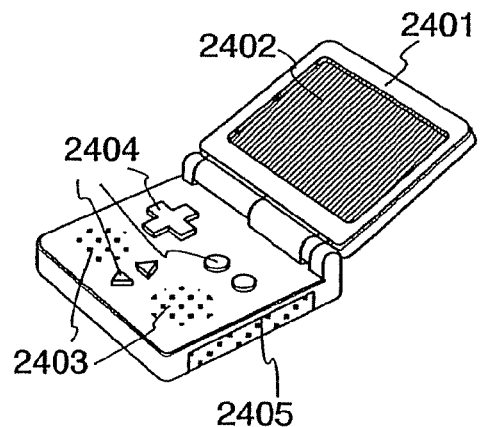
FIG. 8E

LIGHT EMITTING DEVICE

This application is a divisional of application Ser. No. 10/582,718 filed on Jun. 12, 2006 which is the US national stage of PCT/JP2005/017076 filed Sep. 9, 2005.

TECHNICAL FIELD

The present invention relates to a light emitting element that emits light when current flows therethrough, wherein a thin film including a light emitting substance is sandwiched between electrodes, and a display device using the light emitting element. The present invention, in particular, relates to an electronic appliance using the light emitting element.

BACKGROUND ART

Development of a display device using a thin-film light emitting element that emits light upon flowing current therethrough has been carried out actively.

When current flows through the thin-film light emitting element in which a single layer or a multilayer thin film formed using one or both of an organic material and an inorganic material is connected to electrodes, the thin-film light emitting element emits light. Such a thin-film light emitting element has advantages of low power consumption, miniaturization, good visibility and the like, and therefore, expansion of markets for the thin-film light emitting element has been expected.

By forming a light emitting element with a multilayer structure that has different properties for each layer, the light emitting element can emit light more efficiently as compared with a conventional, light emitting element (e.g., see non patent document 1: C. W. Tang et al., Applied Physics Letters, vol. 51, No. 12, pp. 913-915 (1987)).

In the thin-film light emitting element having the multilayer structure, a light emitting laminated body including a hole injecting layer, a hole transporting layer, a light emitting layer, an electron transporting layer, an electron injecting layer and the like is sandwiched between a pair of electrodes. By applying a voltage to one electrode that is higher than that of the other electrode, the light emitting layer can emit light. Further, the hole injecting layer, the hole transporting layer, the electron transporting layer and the electron injecting layer may not be provided depending on an element structure.

In order to form the light emitting laminated body having the above structure, materials having properties that are suitable for the respective layers are selected. In addition, it is necessary to select materials having suitable properties for the respective electrodes, between which the light emitting laminated body is sandwiched.

Concretely, the electrode that applied with a higher voltage than the other electrode should be formed using a material with a large work function (approximately 4.0 eV or more) while the other electrode should be formed using a material with a small work function (approximately 3.8 eV or less).

However, since the materials for these electrodes must be selected in consideration of film properties, manufacturing methods, light transmitting properties, conducting properties and the like, the range of choices for the electrode materials has been narrowed now.

DISCLOSURE OF INVENTION

In view of the above problem, an object of the present invention is to provide a light emitting element or a light emitting device formed without any regard for a work function of an electrode. In particular, an object of the invention is to provide a light emitting element or a light emitting device where the range of choices for electrode materials can be widened.

In an aspect of the present invention, a light emitting device includes a first layer, a second layer and a third layer between mutually-facing first and second electrodes. The first layer is a layer having a donor level. The second layer is a layer containing a light emitting substance or a laminated body at least including a layer that contains a light emitting substance. The third layer is a layer having an acceptor level. The first, second and third layers are sequentially laminated. The second electrode is formed in contact with the first layer and the first electrode is formed in contact with the third layer such that when a potential of the second electrode is set higher than that of the first electrode, holes generated in the second layer are injected in the third layer.

In another aspect of the invention, a light emitting device includes a first layer, a second layer, a third layer and a fourth layer between mutually-facing first and second electrodes. The first and fourth layers are layers having a donor level. The second layer is a layer containing a light emitting substance or a laminated body at least including a layer that contains a light emitting substance. The third layer is a layer having an acceptor level. The first, second, third and fourth layers are sequentially laminated. The second electrode is formed in contact with the first layer and the first electrode is formed in contact with the fourth layer such that when a potential of the second electrode is set higher than that of the first electrode, holes generated in the second layer and electrons generated in the fourth layer are injected in the third layer.

In another aspect of the invention, a light emitting device includes a first layer, a second layer, a third layer, a fourth layer and a fifth layer between mutually-facing first and second electrodes. The first and fourth layers are layers having a donor level. The second layer is a layer containing a light emitting substance or a laminated body at least including a layer that contains a light emitting substance. The third and fifth layers are layers having an acceptor level. The first, second, third, fourth and fifth layers are sequentially laminated. The second electrode is formed in contact with the first layer and the first electrode is formed in contact with the fifth layer such that when a potential of the second electrode is set higher than that of the first electrode, holes generated in the second layer and electrons generated in the fourth layer are injected in the third layer.

In another aspect of the invention, a light emitting device includes a first layer, a second layer and a third layer between mutually-facing first and second electrodes. The first layer includes a first substance of which an electron mobility is higher than a hole mobility and a second substance that can donate electrons to the first substance. The second layer includes a third substance of which a hole mobility is higher than an electron mobility and a forth substance that can accept electrons from the third substance. The third layer is a layer containing a light emitting substance or a laminated body at least including a layer that contains a light emitting substance. The first, second and third layers are sequentially laminated. The second electrode is formed in contact with the first layer and the first electrode is formed in contact with the third layer such that when a potential of the second electrode is set higher than that of the first electrode, holes generated in the second layer are injected in the third layer.

In another aspect of the invention, a light emitting device includes a first layer, a second layer, a third layer and a fourth layer between mutually-facing first and second electrodes. The first layer includes a first substance of which an electron mobility is higher than a hole mobility and a second substance that can donate electrons to the first substance. The second layer includes a third substance of which a hole mobility is higher than an electron mobility and a forth substance that can accept electrons from the third substance. The third layer is a layer containing a light emitting substance or a laminated body at least including a layer that contains a light emitting substance. The fourth layer includes a fifth substance of which an electron mobility is higher than a hole transporting property and a sixth substance that can donate electrons to the fifth substance. The first, second, third and fourth layers are sequentially laminated. The second electrode is formed in contact with the first layer and the first electrode is formed in contact with the fourth layer such that when a potential of the second electrode is set higher than that of the first electrode, holes generated in the second layer and electrons generated in the fourth layer are injected in the third layer.

In another aspect of the invention, a light emitting device includes a first layer, a second layer, a third layer; a fourth layer and a fifth layer between mutually-facing first and second electrodes. The first layer includes a first substance of which an electron mobility is higher than a hole mobility and a second substance that can donate electrons to the first substance. The second layer includes a third substance of which a hole mobility is higher than an electron mobility and a forth substance that can accept electrons from the third substance. The third layer is a layer containing a light emitting substance or a laminated body at least including a layer that contains a light emitting substance. The fourth layer includes a fifth substance of which an electron mobility is higher than a hole mobility and a sixth substance that can donate electrons to the fifth substance. The fifth layer includes a seventh substance of which a hole mobility is higher than an electron mobility and an eighth substance that can accept electrons from the seventh substance. The first, second, third, fourth and fifth layers are sequentially laminated. The second electrode is formed in contact with the first layer and the first electrode is formed in contact with the fifth layer such that when a potential of the second electrode is set higher than that of the first electrode, holes generated in the second layer and electrons generated in the fourth layer are injected in the third layer.

In the light emitting device having the above structure according to the present invention, materials for the electrodes can be selected without any regard for a work function. Therefore, the range of choices for electrode materials can be widened.

BRIEF DESCRIPTION OF DRAWINGS

FIGS. 8A to 8E are diagrams showing examples of electronic appliances to which the present invention is applied;

BEST MODE FOR CARRYING OUT THE INVENTION

The embodiment modes according to the present invention will hereinafter be described referring to the accompanying drawings. It is easily understood by those skilled in the art that the embodiment modes and details herein disclosed can be modified in various ways without departing from the purpose and the scope of the invention. The present invention should not be interpreted as being limited to the description of the embodiment modes to be given below.

Embodiment Mode 1

Figure 1A:
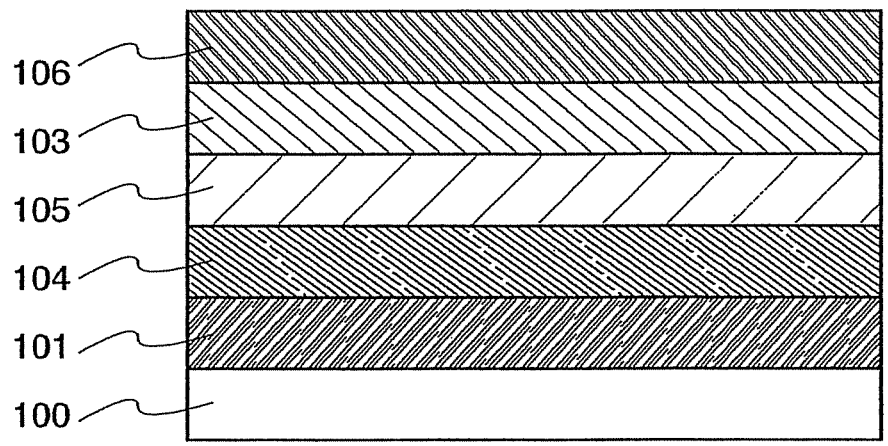
FIGS. 1A and 1B are cross sectional views showing light emitting devices according to the present invention.
Figure 1B:
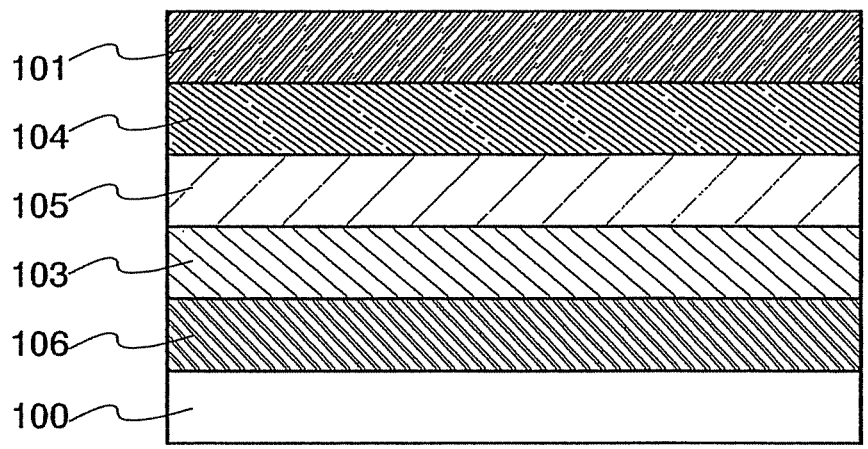

In this embodiment mode, structures of a light emitting device according to the present invention will be described with reference to FIGS. 1A and 1B. In the light emitting device according to the present invention, a light emitting laminated body 104 including a light emitting material, a layer 105 having an acceptor level and a layer 103 having a donor level are laminated to be contacted to one another. Further, the light emitting device comprises a light emitting element with a structure, wherein a first electrode 101 is formed in contact with the light emitting laminated body 104, a second electrode 106 is formed in contact with the layer 103 having the donor level, and a laminated body that includes the light emitting laminated body 104, the layer 105 having the acceptor level and the layer 103 having the donor level is sandwiched between the first electrode 101 and the second electrode 106. This light emitting element is provided on an insulating material 100 with a flat surface such as a substrate and an insulating film. Furthermore, the first electrode 101, the light emitting laminated body 104 including the light emitting material, the layer 105 having the acceptor level and the layer 103 having the donor level may be laminated in this order over the insulating material 100 (FIG. 1A), or they may be laminated in reverse order over the insulating material 100 (FIG. 1B).

By applying a voltage to the light emitting element having the above described structure such that a potential of the first electrode 101 is lower than that of the second electrode 106, light emission can be obtained from the light emitting laminated body 104.

The layer 103 having the donor level can be formed using a layer including both a material with an electron transporting property (a substance of which an electron mobility is higher than a hole mobility) and a material with an electron donating property that can donate electrons to the substance with the electron transporting property, an N-type semiconductor layer, or a layer including an N-type semiconductor. For example, a material including a metal complex having quinoline skeleton or benzoquinoline skeleton such as tris(8-quinolinolato)aluminum (abbreviation: $Alq_3$) tris(4-methyl-8-quinolinolato)aluminum (abbreviation: $Almq_3$), bis(10-hydroxybenzo[h]-quinolinato)beryllium (abbreviation: $BeBq_2$), and bis(2-methyl-8-quinolinolato)-4-phenylphenolate-aluminum (abbreviation: BAlq) can be used as the material with the electron transporting property. In addition, a metal complex having oxazole ligand or thiazole ligand such as bis(2-[2-hydroxyphenyl]benzoxazolate)zinc (abbreviation: $Zn(BOX)_2$) and bis(2-[2-hydroxyphenyl]benzothiazolate)zinc (abbreviation: $Zn(BTZ)_2$) can be used. In addition to the metal complexes, the following substances can be used as the material with the electron transporting property: 2-(4-biphenylyl)-5-(4-tert-butylphenyl)-1,3,4-oxadiazole (abbreviation: PBD); 1,3-bis(5-[p-tert-butylphenyl]-1,3,4-oxadiazole-2-yl)benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); and the like. As the material with the electron donating property, which can donate electrons to these materials with the electron transporting properties, for example, alkali metal such as lithium and cesium, alkali earth metal such as magnesium and calcium, rare-earth metal such as erbium and ytterbium, an alloy containing such metal, a metallic compound and the like can be used. The material with the electron donating property, which can donate electrons, is selected depending on a combination with a material with an electron transporting property. Alternately, a layer including the material with the electron transporting property and the material with the electron donating property may be mixed with a metallic compound typified by molybdenum oxide, zinc oxide, titanium oxide or the like. Furthermore, as the N-type semiconductor, a metallic compound such as metal oxide can be used. Concretely, zinc oxide, zinc sulfide, zinc selenide, titanium oxide and the like can be employed.

The layer 105 having the acceptor level can be formed using a layer including both a material with a hole transporting property (a substance of which a hole mobility is higher than an electron mobility) and a material with an electron accepting property that can accept electrons from the material with the hole transporting property, a P-type semiconductor layer, or a layer including a P-type semiconductor. As the above material with the hole transporting property, for example, an aromatic amine (i.e., which has a benzene ring-nitrogen bond) compound such as 4,4'-bis(N-[1-naphthyl]-N-phenyl-amino)-biphenyl (abbreviation: α-NPD), 4,4'-bis(N-[3-methylphenyl]-N-phenyl-amino)biphenyl (abbreviation: TPD), 4,4',4"-tris(N,N-diphenyl-amino)-triphenylamine (abbreviation: TDATA), 4,4',4"-tris(N-[3-methylphenyl]-N-phenyl-amino)-triphenylamine (abbreviation: MTDATA), and 4,4'-bis(N-(4-[N,N-di-m-tolylamino]phenyl)-N-phenylamino)biphenyl (abbreviation: DNTPD); a phthalocyanine compound such as phthalocyanine (abbreviation: $H_2Pc$), copper phthalocyanine (abbreviation: CuPc) and vanadyl phthalocyanine (abbreviation: VOPc) can be used. Also, as the material having the electron accepting property, which can accept electrons from these materials with the hole transporting properties, for example, molybdenum oxide, vanadium oxide, 7,7,8,8-tetracyanoquinodimethane (abbreviation: TCNQ), 2,3-dicyano naphthoquinone (abbreviation: DCNNQ), 2,3,5,6-tetrafluoro-7,7,8,8-tetracyanoquinodimethane (abbreviation: F4-TCNQ), and the like can be given. Further, a material with an electron accepting property, which can accept electrons, is selected depending on a combination with a material with a hole transporting property. As the P-type semiconductor, metal oxide such as molybdenum oxide, vanadium oxide, ruthenium oxide, cobalt oxide, nickel oxide, and copper oxide can be used.

The light emitting laminated body 104 includes a plurality of layers that include at least a light emitting layer. An electron transporting layer may be provided between the light emitting layer of the light emitting laminated body 104 and the first electrode 101 whereas a hole transporting layer may be provided between a layer, in which a light emitting material is dispersed, of the light emitting laminated body 104 and the layer 105 having the acceptor level. These electron transporting layer and the hole transporting layer may not be provided, or, any one of them may be provided. Since materials for the hole transporting layer and the electron transporting layer are same as the material with the hole transporting property included in the layer having the acceptor level or the material with the electron transporting property included in the layer having the donor level, the materials for the hole and electron transporting layers are not described here. For more details, please refer to the respective descriptions. Furthermore, the light emitting laminated body 104 may have a single layer structure only including a light emitting layer.

Light emitting layers that can be applied to the light emitting laminated body 104 are largely classified into two types. One is a layer made from a material with a larger energy gap than that of a light emitting substance, wherein a light emitting material that becomes a luminescent center is dispersed. The other one is a layer only including a light emitting material. The former layer is preferable since concentration quenching is difficult to be caused. As the light emitting substance that becomes the luminescent center, 4-dicyanomethylene-2-methyl-6-(1,1,7,7-tetramethyljulolidil-9-enyl)-4H-pyran (abbreviation: DCJT); 4-dicyanomethylene-2-t-butyl-6-(1,1,7,7-tetramethyljulolidil-9-enyl)-4H-pyran; periflanthene; 2,5-dicyano-1,4-bis(10-methoxy-1,1,7,7-tetramethyljulolidil-9-enyl)benzene; N,N'-dimethylquinacridon (abbreviation: DMQd); coumarin 6; coumarin 545T; tris(8-quinolinolate)aluminum (abbreviation: $Alq_3$); 9,9'-bianthryl; 9,10-diphenylanthracene (abbreviation: DPA); 9,10-bis(2-naphthyl)anthracene (abbreviation: DNA); 2,5,8, 11-tetra-t-butylperylene (abbreviation: TBP) and the like can be given. Also, as a host material into which the above mentioned light emitting material is dispersed, an anthracene derivative such as 9,10-di(2-naphthyl)-2-tert-butylanthracene (abbreviation: t-BuDNA); a carbazole derivative such as 4,4'-bis(N-carbazolyl)biphenyl (abbreviation: CBP); a metal complex such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)-4-phenylphenolate-aluminum (abbreviation: BAlq), bis(2-[2-hydroxyphenyl]pyridinato)zinc (abbreviation: $Znpp_2$) and bis(2-[2-hydroxyphenyl]benzoxazolato)zinc (abbreviation: ZnBOX), and the like can be used. Furthermore, the light emitting laminated body 104 can be formed by only using a light emitting substance such as tris(8-quinolinolato) aluminum (abbreviation: $Alq_3$), 9,10-bis(2-naphthyl)anthracene (abbreviation: DNA), and bis(2-methyl-8-quinolinolato)-4-phenylphenolate-aluminum (abbreviation: BAlq).

The first electrode 101 is preferably formed using metal, an alloy, an electrically conducting compound, or a mixture thereof having a low work function (the work function is 3.8 eV or less). As specific examples of the materials of the first electrode, an element belonging to group 1 or 2 of the periodic table, i.e., alkali metal such as Li and Cs, alkali earth metal such as Mg, Ca and Sr; an alloy including these elements (Mg:Ag, Al:Li or the like); a compound including these elements (LiF, CsF, $CaF_2$ or the like) can be given. Also, the first electrode can be formed using transition metal containing rare earth metal. In addition, these cathode materials, can be formed by being laminated with metal (including an alloy) such as Al, Ag and ITO.

The second electrode 106 can be formed by using a conductive film, for example, metal having a conducting property such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr) and titanium (Ti); an alloy thereof; nitride of a metal material (e.g., TiN); metal oxide such as ITO (indium tin oxide), ITO containing silicon and IZO (indium zinc oxide) in which 2 to 20% zinc oxide (ZnO) is mixed with indium oxide; and the like.

When light is emitted through the second electrode, the second electrode may be formed of a conductive film having a light transmitting property. Concretely, this second electrode is formed by using metal oxide such as ITO (indium tin oxide), ITO containing silicon, and IZO (indium zinc oxide) in which 2 to 20% zinc oxide (ZnO) is mixed with indium oxide. Besides, an extremely thin film of metal such as Al and Ag is used. Meanwhile, when light is emitted through the first electrode, the second electrode can be formed using a material having high reflectance (such as Al and Ag).

In the light emitting device of the present embodiment mode according to the present invention, since the layer 103 having the donor level is formed in contact with the second electrode, a material for the second electrode can be selected without any regard for a work function, which allows to widen the range of choices for a material of the second electrode. As a consequence, a material suitable for the structure of the light emitting device can be used.

Further, the above-mentioned materials are just examples. Materials can be arbitrarily selected without departing from a purpose of the present invention.

In the light emitting device having the above structure according to the present invention, when the voltage is applied to the light emitting device such that a potential of the second electrode 106 is set higher than that of the first electrode 101, electrons are injected in the second electrode from the layer 103 having the donor level. Also, holes are injected in the light emitting laminated body 104 from the layer 105 having the acceptor level. In addition, electrons are injected in the light emitting laminated body 104 from the first electrode 101. The injected electrons and the holes are recombined in the light emitting laminated body. When the light emitting material, which is excited, returns to a ground state, light emission is obtained. Since the light emitting device of the present invention is operated by injecting the electrons in the second electrode 106 from the layer 103 having the donor level rather than injecting the holes in the layer 103 having the donor level from the second electrode, a work function of the second electrode 106 can be ignored. Accordingly, a material for the second electrode 106 can be selected without any regard for a work function. When selecting a material for the second electrode, the range of choices for a material can be widened. Consequently, a material that is suitable for the structure of the light emitting device according to the invention can be used.

Embodiment Mode 2

Figure 2A:
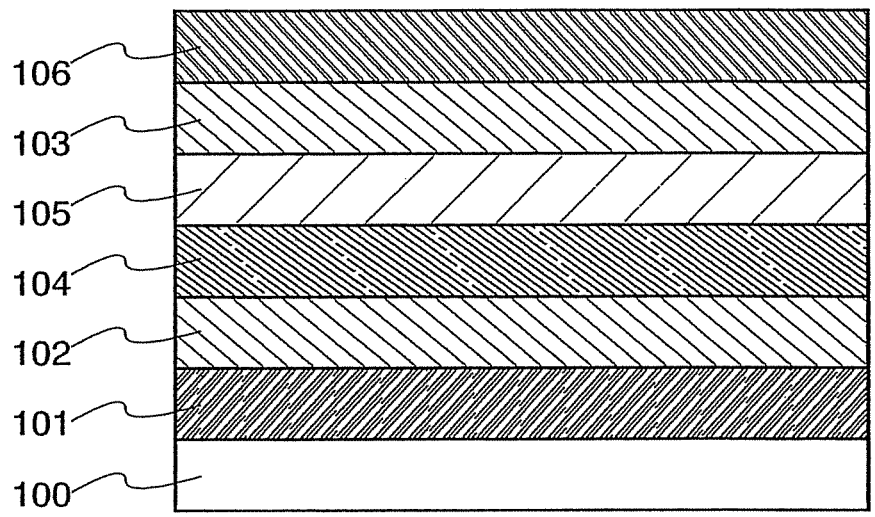
FIGS. 2A and 2B are cross sectional views showing light emitting devices according to the present invention.
Figure 2B:
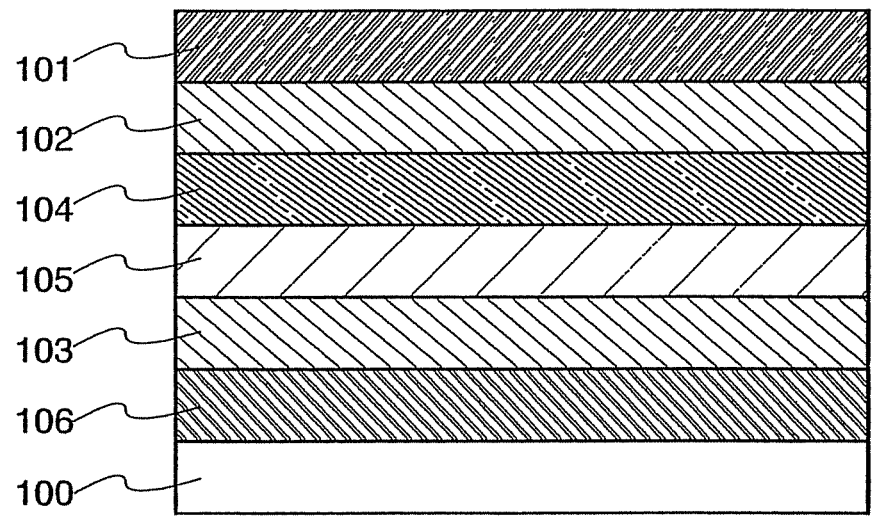

In this embodiment mode, a structure of a light emitting device according to the present invention will be described with reference to FIGS. 2A and 2B. In the light emitting device of the invention, a first layer 102 having a donor level, a light emitting laminated body 104, a layer 105 having an acceptor level and a second layer 103 having a donor level are laminated. Further, the light emitting device comprises a light emitting element having a structure in which the first electrode 101 is formed in contact with the first layer 102 having the donor level, the second electrode 106 is formed in contact with the second layer 103 having the donor level, and a laminated body that includes the first layer 102 having the donor level, the layer 105 having the acceptor level and the second layer 103 having the donor level is sandwiched between the first and second electrodes 101 and 106. This light emitting element is laminated on an insulating material 100 such as a substrate and an insulating film. The first electrode 101, the first layer 102 having the donor level, the light emitting laminated body 104, the layer 105 having the acceptor level, the second layer 103 having the donor level, and the second electrode 106 may be laminated in this order over the insulating material 100 such as a substrate and an insulating film (FIG. 2A). Alternatively, the second electrode 106, the second layer 103 having the donor level, the layer 105 having the acceptor level, the light emitting laminated body 104, the first layer 102 having the donor level, and the first electrode 101 may be laminated over the insulating material 100 in this order (FIG. 2B).

When the voltage is applied to the light emitting element having this structure such that a potential of the first electrode 101 is lower than that of the second electrode, the light emitting laminated body 104 emits light.

The first layer 102 having the donor level and the second layer 103 having the donor level can be formed using different materials or a same material. They can be formed using the same material as the layer 103 having the donor level of Embodiment Mode 1. Please refer to the description about the materials for the layer 103 having the donor level of Embodiment Mode 1.

The layer 105 having the acceptor level can be formed using the same material as the layer 105 having the acceptor level of Embodiment Mode 1. Please refer to the description about the materials for the layer 105 having the acceptor level of Embodiment Mode 1.

The light emitting laminated body 104 including a light emitting material is similar to that of Embodiment Mode 1, except that an electron injecting layer and an electron transporting layer of the light emitting laminated body may be provided between the first layer 102 having the donor level and a light emitting layer. Another structure of the light emitting laminated body 104 can refer to the description about the light emitting laminated body 104 of Embodiment Mode 1.

The first electrode 101 is preferably formed using metal, an alloy, an electrically conducting compound and a mixture thereof having a low work function (the work function is 3.8 eV or less). As specific examples of materials of the first electrode, an element belonging to group 1 or 2 of the periodic table, i.e., alkali metal such as Li and Cs, alkali earth metal such as Mg, Ca, and Sr; an alloy including these elements (Mg:Ag, Al:Li or the like); a compound including these elements (LiF, CsF, $CaF_2$ or the like) can be given. Also, the first electrode can be formed using transition metal containing rare earth metal. In addition, these cathode materials can be formed by being laminated with metal (including an alloy) such as Al, Ag and ITO.

The second electrode 106 can be formed by using a conductive film, for example, metal having a conducting property such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr) and titanium (Ti); an alloy thereof; nitride of a metal material (e.g., TiN); metal oxide such as ITO (indium tin oxide), ITO containing silicon and IZO (indium zinc oxide) in which 2 to 20% zinc oxide (ZnO) is mixed with indium oxide; and the like.

When light is emitted through the second electrode, the second electrode may be formed of a conductive film having a light transmitting property. Concretely, this second electrode is formed by using metal oxide such as ITO (indium tin oxide), ITO containing silicon, and IZO (indium zinc oxide) in which 2 to 20% zinc oxide (ZnO) is mixed with indium oxide. Besides, an extremely thin film of metal such as Al and Ag is used. Meanwhile, when light is emitted through the first electrode, the second electrode can be formed using a material having high reflectance (such as Al and Ag).

In the light emitting device of the present embodiment mode according to the present invention, since the second layer 103 having the donor level is formed in contact with the second electrode, a material for the second electrode can be selected without any regard for a work function, which allows to widen the range of choice of the material for the second electrode. As a consequence, a material suitable for the structure of the light emitting device can be used.

Further, the above-mentioned materials are just examples. Materials can be arbitrarily selected without departing from a purpose of the present invention.

In the light emitting device having the above structure according to the present invention, when the voltage is applied to the light emitting device such that a potential of the second electrode 106 is higher than that of the first electrode 101, electrons are injected in the second electrode from the second layer 103 having the donor level. Also, holes are injected in the light emitting laminated body 104 from the layer 105 having the acceptor level. In addition, electrons are injected in the light emitting laminated body 104 from the first layer 102 having the donor level. The injected electrons and the holes are recombined in the light emitting laminated body.

When the light emitting material, which is excited, returns to a ground state, light emission can be obtained. Since the light emitting device of the present invention is operated by injecting the electrons in the second electrode from the second layer 103 having the donor level rather than injecting the holes in the second layer 103 having the donor level from the first electrode 101, a work function of the second electrode 106 can be ignored. Accordingly, a material for the second electrode 106 can be selected without any regard for a work function. When selecting a material for the second electrode, the range of choice for the material can be widened. Consequently, a material that is suitable for the structure of the light emitting device according to the invention can be used.

Embodiment Mode 3

Figure 3A:
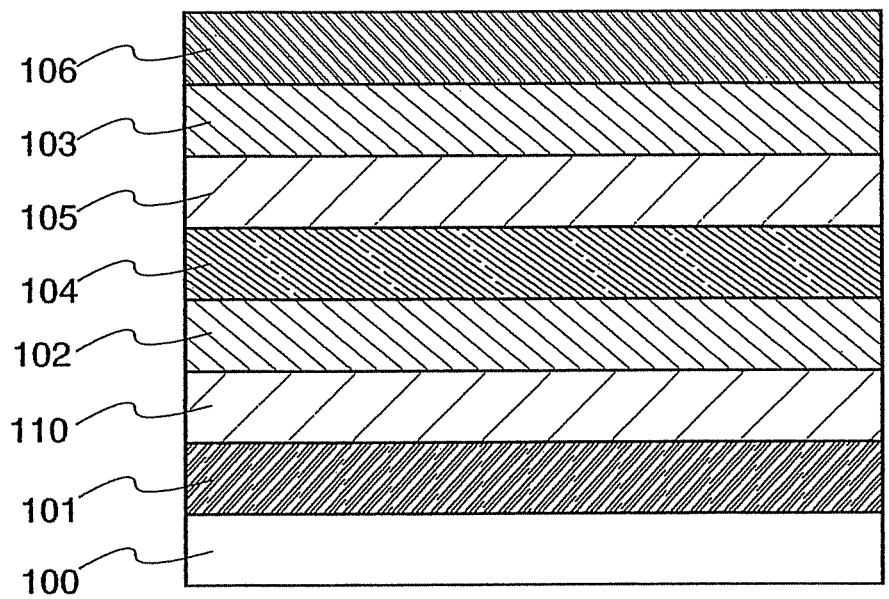
FIGS. 3A and 3B are cross sectional views showing light emitting devices according to the present invention.
Figure 3B:
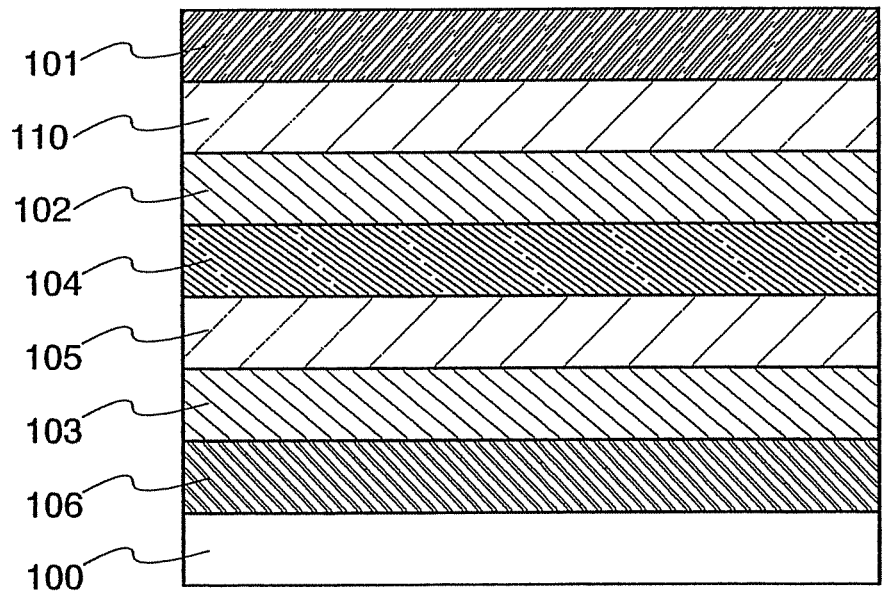

A structure of a light emitting device of the present invention will be described in this embodiment mode with reference to FIGS. 3A and 3B. In the light emitting device of the invention, a first layer 110 having an acceptor level, a first layer 102 having a donor level, a light emitting laminated body 104, a second layer 105 having an acceptor level, and a second layer 103 having a donor level are laminated. The light emitting device also comprises a light emitting element with a structure, wherein the first electrode 101 is formed in contact with the first layer 110 having the acceptor level, the second electrode 106 is formed in contact with the second layer 103 having the donor level, and a laminated body that includes the first layer 110 having the acceptor level, the first layer 102 having the donor level, the light emitting laminated body 104, the second layer 105 having the acceptor level and the second layer 103 having the donor level is sandwiched between a first electrode 101 and a second electrode 102. Further, this light emitting element is laminated on an insulating material 100 such as a substrate and an insulating film. The first electrode 101, the first layer 110 having the acceptor level, the first layer 102 having the donor level, the light emitting laminated body 104, the second layer 105 having the acceptor level, the second layer 103 having the donor level, and the second electrode 106 are laminated in this order over the insulating material 100 such as a substrate and an insulating film (FIG. 3A). Alternatively, the second electrode 106, the second layer 103 having the donor level, the second layer 105 having the acceptor level, the light emitting laminated body 104, the first layer 102 having the donor level, the first layer 110 having the acceptor level, and the first electrode 101 are laminated in this order over the insulating material 100 (FIG. 3B).

When the voltage is applied to the light emitting element having this structure such that a potential of the first electrode 101 is lower than that of the second electrode, the light emitting laminated body 104 can emit light.

The first layer 102 having the donor level and the second layer 103 having the donor level can be formed using different materials or a same material. They can be formed using the same material as the layer 103 having the donor level of Embodiment Mode 1. Please refer to the description about the materials for the layer 103 having the donor level of Embodiment Mode 1.

The first layer 110 having the acceptor level and the second layer 105 having the acceptor level can also be formed using different materials or a same material. They can be formed using the same material as the layer 105 having the acceptor level of Embodiment Mode 1. Please refer to the description about the materials for the layer 105 having the acceptor level of Embodiment Mode 1.

The light emitting laminated body 104 including a light emitting material is similar to that of Embodiment Mode 1, except that an electron injecting layer and an electron transporting layer of the light emitting laminated body may be provided between the first layer 102 having the donor level and a light emitting layer. Another structure of the light emitting laminated body 104 can refer to the description about the light emitting laminated body 104 of Embodiment Mode 1.

The first electrode 101 and the second electrode 106 can be formed by using a conductive film, for example, metal having a conducting property such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr) and titanium (Ti); an alloy thereof; nitride of a metal material (e.g., TiN); metal oxide such as ITO (indium tin oxide). ITO containing silicon and IZO (indium zinc oxide) in which 2 to 20% zinc oxide (ZnO) is mixed with indium oxide; and the like.

An electrode through which light is emitted may be formed of a conductive film having a light transmitting property. Concretely, this electrode is formed by using metal oxide such as ITO (indium tin oxide), ITO containing silicon, and IZO (indium zinc oxide) in which 2 to 20% zinc oxide (ZnO) is mixed with indium oxide. Besides, an extremely thin film of metal such as Al and Ag is used. As for the other electrode, a material having high reflectance (such as Al and Ag) can be preferably used.

In the light emitting device of the present embodiment mode according to the present invention, since the first layer 110 having the acceptor level is formed in contact with the first electrode 101 and the second layer 103 having the donor level is formed in contact with the second electrode, materials for the first and second electrodes 101 and 106 can be selected without any regard for a work function. In addition, the range of choices for materials for the first and second electrodes 101 and 106 can be widened. As a consequence, materials suitable for the structure of the light emitting device can be used.

Further, the above-mentioned materials are just examples. Materials can be arbitrarily selected without departing from a purpose of the present invention.

In the light emitting device having the above structure according to the present invention, when the voltage is applied to the light emitting device such that a potential of the second electrode 106 is higher than that of the first electrode 101, holes are injected in the first electrode 101 from the first layer 110 having the acceptor level and electrons are injected in the second electrode from the second layer 103 having the donor level. Also, holes are injected in the light emitting laminated body 104 from the second layer 105 having the acceptor level. Further, the electrons are injected in the light emitting laminated body 104 from the first layer 102 having the donor level. The injected electrons and the holes are recombined in the light emitting laminated body. When the excited light emitting material returns to a ground state, light is generated. The light emitting device of the present invention is operated by injecting the holes in the first electrode 101 from the first layer 110 having the acceptor level and by injecting the electrons in the second electrode from the second layer 103 having the donor level rather than injecting the electrons in the first layer 110 having the acceptor level from the first electrode 101 and injecting the holes in the second layer 103 having the donor level from the second electrode 106, work functions of the first and second electrodes 101 and 106 can be ignored. Accordingly, materials for the first and second electrodes 101 and 106 can be selected without any regard for the work functions, which makes it possible to widen the range of choices for the materials. Consequently, materials that are suitable for the structure of the light emitting device according to the invention can be used.

Embodiment Mode 4

Another embodiment mode of the present invention will be described. In this embodiment mode, an example of improving a viewing angle characteristic of a light emitting device by adjusting a thickness of a layer having an acceptor level will be described. The laminated structure and the materials of a light emitting element are same as those of Embodiment Modes 1 to 3 and will not be further described here. Please refer to Embodiment Modes 1 to 3.

Light emitted from a light emitting element includes light that is directly emitted to the outside from the light emitting laminated body 104 and light that is emitted to the outside by being reflected one or more times. The light directly emitted to the outside from the light emitting laminated body and the light emitted to the outside by being reflected are interfered with each other and strengthened or weakened to each other due to their phase relation. The light emitted from the light emitting element is light that is synthesized as a result of the interference.

When light is reflected upon entering into a medium with a high refractive index from a medium with a low refractive index, its phase is inverted. Therefore, in a light emitting element of a light emitting device having the structure as shown in Embodiment Mode 1, the phase of reflected light that is reflected at an interface between the first electrode 101 or the second electrode 106 and a layer contacting to the electrode is inverted. At this electrode, upon interfering the reflected light with light generated in a light emitting layer, when an optical distance between the light emitting layer and the electrode (i.e., refractive index×physical distance) satisfies $(2m-1)\lambda/4$ (m is a natural number of 1 or more, and $\lambda$ is a center wavelength of light generated from the light emitting layer), the changes in spectrum shape caused depending on an angle of seeing a light emitting surface can be reduced and the current efficiency of the light emitting element can be improved. The current efficiency indicates the level of luminance that is obtained by current flowing through the light emitting element. As the current efficiency is improved, the predetermined level of luminance can be obtained, even though there is a small amount of current. In addition, the degree of deterioration in the element tends to be lowered.

The reflection is hardly caused between films having small difference in refractive indexes. Therefore, the reflection caused except in an interface between an electrode and a film contacting to the electrode is ignorable. Accordingly, this embodiment mode focuses on only the reflection caused between an electrode and a film contacting to the electrode.

In the case of a light emitting device where light is emitted through the first electrode 101, the reflection is caused at the second electrode 106. In order to improve the current efficiency of the light emitting element of this light emitting device and reduce the changes in the spectrum shape that are caused depending on an angle of seeing a light emitting surface, an optical distance between a position where the light emission is caused and a surface of the second electrode 106 (i.e., refractive index×physical distance) may be set to satisfy $(2m-1)\lambda/4$ (m is a natural number of 1 or more, and $\lambda$ is a center wavelength of light generated from the light emitting layer).

The light emitting laminated body 104 may include a single layer of a light emitting layer that contains a light emitting material. Alternatively, the light emitting laminated body may include plural layers such as an electron transporting layer and a hole transporting layer along with a light emitting layer. The light emitting layer may be a layer in which a light emitting material that becomes a luminescent center is dispersed, or a layer only including a light emitting material.

Further, several layers made from different materials are provided between the portion where the light emission is caused and the second electrode 106. In this embodiment mode, the layer 105 having the acceptor level and the second layer 103 having the donor level are positioned between the portion where the light emission is caused and the second electrode 106. With respect to the light emitting laminated body 104 having a single layer, a portion between a light emitting position of the light emitting laminated body 104 and the second electrode 106 can be referred to as the layers positioned between the portion where the light emission is caused and the second electrode. In the case where the light emitting laminated body 104 includes plural layers, more different layers may be positioned between the portion where the light emission is caused and the second electrode 106. In such a structure, in order to find the optical distance between the portion where the light emission is caused and the second electrode 106, the refractive index of each film may be multiplied by the thickness thereof and products of these multiplications for the respective films may be added up. The sum is set to satisfy $(2m-1)\lambda/4$ (m is a natural number of 1 or more, and $\lambda$ is a center wavelength of light generated from the light emitting layer). That is, when the light emitting layer is denoted by "1" and the second electrode 106 is denoted by "j" (j is an integer) while layers positioned between the layer containing a light emitting material and the second electrode 106 are assigned with serial numbers such that a refractive index "n" and a thickness "d" that are assigned with a certain number indicate a refractive index and a thickness of one layer that is assigned with the same number (i.e., "$n_1$" indicates a refractive index of the light emitting layer and "$d_j$" indicates a thickness of the second electrode 106), the following expression 1 is satisfied.

[Expression 1]

$$\sum_{k=2}^{j-1} n_k d_k \le \frac{(2m-1)\lambda}{4} \le n_1 d_1 + \sum_{k=2}^{j-1} n_k d_k \quad (1)$$

Since the light emitting layer has some degree of thickness and numerous luminescent centers, it is impossible to determine a position where the light emission is caused, precisely. Accordingly, the expression 1 has some range for the thickness of the light emitting layer.

To satisfy the expression 1, it is necessary to adjust the thicknesses here. A layer mainly containing an organic material has a low electron mobility. When a thickness of a layer a donor level is increased, the driving voltage is also increased. Therefore, in this embodiment mode, by adjusting the thickness of the layer 105 having the acceptor level that has relatively higher conducting property in the layer mainly containing an organic material, the expression 1 can be satisfied without increasing the driving voltage largely. Furthermore, when a layer having a donor level contains large amounts of a substance that can donate electrons to a material with an electron transporting property such as lithium, the layer having the donor level can be used as a layer for adjusting a film thickness so as to satisfy the above expression 1.

In the case of a light emitting element where light is emitted through the second electrode 106, the reflection is caused at the first electrode 101. Therefore, in order to improve the current efficiency of the light emitting element and reduce the changes in the spectrum shape that are caused depending on an angle of seeing a light emitting surface, an optical distance between a position where the light emission is caused and a surface of the first electrode 101 (i.e., refractive index×physical distance) may be set to satisfy $(2m-1)\lambda/4$ (m is a natural number of 1 or more, and $\lambda$ is a center wavelength of light generated from the light emitting layer).

The light emitting laminated body 104 may include a single layer of a light emitting layer that contains a light emitting material. Alternatively, the light emitting laminated body may include plural layers such as an electron transporting layer and a hole transporting layer along with a light emitting layer. The light emitting layer may be a layer in which a light emitting material that becomes a luminescent center is dispersed, or a layer only including a light emitting material.

Further, several layers made from different materials are provided between a portion where the light emission is caused and the first electrode 101. In Embodiment Mode 3, the first layer 110 having the acceptor level and a first layer 102 having the donor level is provided between the portion where the light emission is caused and the first electrode 101. With respect to a layer including a light emitting material, a part of the layer containing the light emitting material other than a light emitting portion can also be referred to as a layer positioned between the portion where the light emission is caused and the first electrode 101. Also, when the light emitting laminated body 104 includes plural layers, more different layers may be provided between the portion where the light emission is caused and the first electrode 101. In such a structure, in order to find the optical distance between the portion where the light emission is caused and the first electrode 101, the refractive index of each film may be multiplied by the thickness thereof and products of these multiplications for the respective films may be added up. That is, when a layer including a light emitting material is denoted by "1" and the first electrode 101 is denoted by "j" ("j" is an integer) while layers positioned between the layer including the light emitting material and the first electrode 101 are assigned with serial numbers and a refractive index n and a thickness d that are assigned with a certain number represent a refractive index and a thickness of one layer that is assigned with the same number (i.e., "$n_1$" indicates a refractive index of the layer containing the light emitting material and "$d_j$" indicates a thickness of the first electrode 101), the following expression 2 is satisfied.

[Expression 2]

$$\sum_{k=2}^{j-1} n_k d_k \le \frac{(2m-1)\lambda}{4} \le n_1 d_1 + \sum_{k=2}^{j-1} n_k d_k \quad (2)$$

In the expression 2, since the light emitting layer has some degree of thickness and numerous luminescent centers, it is impossible to determine a position where the light emission is caused, precisely. Accordingly, the expression 2 has some range for the thickness of the light emitting layer.

To satisfy the expression 2, it is necessary to adjust the thicknesses here. In Embodiment Mode 3, by adjusting the thickness of the first layer 110 having the acceptor level that has relatively higher conducting property in the layer mainly containing an organic material, the expression 2 can be satisfied without increasing the driving voltage. Furthermore, in the case where the first layer 110 having the acceptor level is not provided as explained in Embodiment Mode 2, when a layer having a donor level of which a carrier is an electron contains large amounts of a substance that can donate electrons to a material with an electron transporting property such as lithium, the first layer 102 having the donor level can be used as a layer for adjusting a film thickness so as to satisfy the expression 2.

Moreover, in the case of a structure in which light is emitted through both the first electrode 101 and the second electrode 106, the structure may be set to satisfy both the expression 1 and the expression 2.

By forming a light emitting element with the structure described in this embodiment mode, a light emitting device where the changes in emission spectrum depending on an angle of seeing a light emitting surface are reduced can be provided.

The present embodiment mode can be implemented by being freely combined with Embodiment modes 1 through 3.

Embodiment Mode 5

In the present embodiment mode, a display device as described in Embodiment Mode 1 or 2 and a method for manufacturing thereof will be described with reference to FIGS. 4A to 4E and FIGS. 5A to 5C. This embodiment mode will shows an example of a method for manufacturing an active matrix display device; however, the light emitting device of the invention can also be applied to a passive matrix display device.

A first base insulating layer 51a and a second base insulating layer 51b are formed over a substrate 50. Thereafter, a semiconductor layer is also formed on the second base insulating layer 51b.

As a material for the substrate 50, glass, quartz, plastic (e.g., polyimide, acrylic, polyethylene terephthalate, polycarbonate, polyacrylate, polyether sulfone or the like), and the like can be used. These substrates may be polished by CMP or the like, if necessary. In this embodiment mode, a glass substrate is used.

The first and second base insulating layers 51a and 51b are provided to prevent elements that adversely affects the characteristics of the semiconductor film such as alkali metal and alkali earth metal from dispersing into the semiconductor layer. The first and second base insulating layers 51a and 51b can be formed using silicon oxide, silicon nitride, silicon oxide containing nitrogen, silicon nitride containing oxygen, and the like. In this embodiment mode, the first base insulating layer 51a is formed of silicon nitride while the second base insulating layer 51b is formed of silicon oxide. A base insulating film including two layers of the first and second base insulating layers 51a and 51b is formed in this embodiment mode. However, the base insulating film may be formed to have a single layer or two or more layers. In addition, when the dispersion of an impurity element through the substrate is not particularly concerned, the base insulating layers may not be provided.

Subsequently, the semiconductor layer is formed by crystallizing an amorphous silicon film using a laser light in this embodiment mode. Concretely, an amorphous silicon film is formed with a thickness of 25 to 100 nm (preferably, 30 to 60 nm) on the second base insulating layer 51b. As a method for manufacturing the semiconductor layer, for example, a known method such as sputtering, reduced pressure CVD and plasma CVD can be used. Thereafter, a heat treatment is performed at 500° C. for 1 hour to perform dehydrogenation.

Subsequently, the amorphous silicon film is crystallized by using a laser irradiation apparatus to form a crystalline silicon film. In the laser crystallization of the present embodiment mode, excimer laser is used. Laser beam oscillated from the excimer laser is processed into a linear beam spot using an optical system. The amorphous silicon film is irradiated with the linear beam spot to form the crystalline silicon film. The obtained crystalline silicon film is used as the semiconductor layer.

As another methods for crystallizing the amorphous silicon film, there are a method for crystallizing it only by using a heat treatment and a method for crystallizing it using a catalytic element that promotes crystallization by performing a heat treatment. As the element, which promotes the crystallization, nickel, iron, palladium, tin, zinc, cobalt, platinum, copper, gold and the like can be used. By using such an element, crystallization can be performed at lower temperature and shorter times as compared with the case of performing the crystallization only using the heat treatment, thereby reducing damages with respect to the glass substrate and the like. When the amorphous silicon film is crystallized only by using a heat treatment, a quartz substrate or the like that is resistant to heat may be used as the substrate 50.

Subsequently, a minute amount of impurities is added into the semiconductor layer to control a threshold value, i.e., channel doping is performed, if necessary. In order to obtain a required threshold value, N-type or P-type impurities (phosphorus, boron, or the like) are added into the semiconductor layer by ion doping or the like.

Figure 4A:
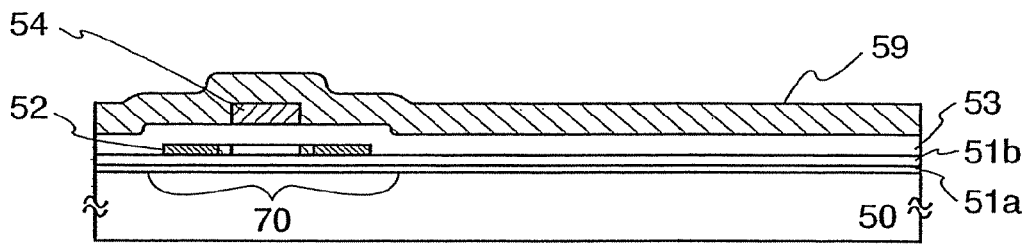
FIGS. 4A to 4E are cross sectional views showing steps of manufacturing a thin-film light emitting element according to the invention.

Thereafter, as show in FIG. 4A, the semiconductor layer is patterned into a predetermined shape to obtain an island-like semiconductor layer 52. Concretely, after applying a photoresist to the surface of the semiconductor layer, the photoresist is exposed and baked so as to form a resist mask with a predetermined shape on the semiconductor layer. The semiconductor layer is patterned by etching while utilizing this resist mask.

Subsequently, a gate insulating layer 53 is formed to cover the island-like semiconductor layer 52. An insulating layer containing silicon is formed to have a thickness of 40 to 150 nm by plasma CVD or sputtering as the gate insulating layer 53. In this embodiment mode, the gate insulating layer is formed using silicon oxide.

Next, a gate electrode 54 is formed on the gate insulating layer 53. The gate electrode 54 may be formed using an element selected from tantalum, tungsten, titanium, molybdenum, aluminum, copper, chromium, and niobium, or an alloy material or a compound material mainly including the above elements. Alternatively, a semiconductor film typified by a polycrystalline silicon film doped with an impurity element such as phosphorus may be used. Also, an AgPdCu alloy may be used.

In this embodiment mode, the gate electrode 54 is formed to have a single layer. Alternatively, the gate electrode may be formed to have a laminated structure including two or more layers, e.g., a lower layer made from tungsten and an upper layer made from molybdenum. In the case of forming the gate electrode with the laminated structure, the materials mentioned above are preferably used. Also, a combination of the materials may arbitrarily be selected. The gate electrode 54 is processed by etching while utilizing a mask made from photoresist.

Subsequently, a high concentration impurity is added to the semiconductor layer 52 while utilizing the gate electrode 54 as a mask. Thus, a thin film transistor 70 including the semiconductor layer 52, the gate insulating layer 53, and the gate electrode 54 is formed.

Further, the process of manufacturing the thin film transistor is not particularly limited here, and the process thereof may be arbitrarily changed so as to manufacture a transistor with a desired structure.

Although a top-gate thin film transistor using the crystalline silicon film, which is crystallized, by laser crystallization, is employed in this embodiment mode, a bottom-gate thin film transistor using an amorphous semiconductor film can be used in a pixel portion. As the amorphous semiconductor, silicon germanium can be also used in addition to silicon. When using the silicon germanium, the concentration of the germanium is preferably about 0.01 to 4.5 atomic %.

Also, a microcrystalline semiconductor film (i.e., a semi-amorphous semiconductor), where 0.5 to 20 nm crystal grains can be observed in an amorphous semiconductor, may be used. A minute crystal in which 0.5 to 20 nm crystal grains can be observed is also referred to as a microcrystal (μc).

The semiamorphous silicon (SAS), which is the semiamorphous semiconductor, can be formed by glow discharge decomposition with silicide gas. As a representative silicide gas, $SiH_4$ can be used. In addition, $Si_2H_6$, $SiH_2Cl_2$, $SiHCl_3$, $SiCl_4$, $SiF_4$ and the like can be used. The silicide gas may also be diluted with hydrogen, or a mixture of hydrogen and one or more of rare gas elements selected from helium, argon, krypton and neon. This allows to form the SAS easily. The dilution ratio is preferably set to be in the range of 1:10 to 1:1,000. The generation of a subject film due to reaction of the glow discharge decomposition may be performed at a pressure in the range of 0.1 to 133 Pa. The power frequency is set to be 1 to 120 MHz, and preferably, 13 to 60 MHz. The substrate heating temperature may be set to be 300° C. or less, and more preferably, 100 to 250° C.

Raman spectrum due to L-O phonon is shifted toward lower wavenumbers than 520 cm$^{-1}$ in the SAS formed in the above-mentioned method. The diffraction peaks of (111) and (220), which are believed to be derived from Si crystal lattice, are observed in the SAS by the X-ray diffraction. The SAS contains hydrogen or halogen of at least 1 atom % or more to terminate dangling bonds. With respect to impurity elements contained in the film, each concentration of impurities for atmospheric constituents such as oxygen, nitrogen and carbon is preferably set to be $1\times10^{20}$ atoms/cm$^3$ or less. In particular, the oxygen concentration is set to be $5\times10^{19}$ atoms/cm$^3$ or less, and preferably, $1\times10^{19}$ atoms/cm$^3$ or less. The field effect mobility μ is 1 to 10 cm$^2$/Vsec in a TFT.

Moreover, the SAS may be further crystallized by laser to be used.

Subsequently, an insulating film (a hydrogenated film) 59 is formed by using silicon nitride so as to cover the gate electrode 54 and the gate insulating layer 53. The insulating film (hydrogenated film) 59 is heated at 480° C. for 1 hour to activate the impurity element and hydrogenate the semiconductor layer 52. (FIG. 4A)

Figure 4B:
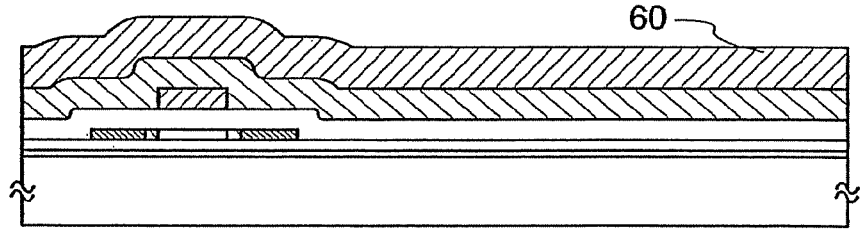

A first interlayer insulating layer 60 is formed to cover the insulating film (hydrogenated film) 59. As a material for forming the first interlayer insulating layer 60, silicon oxide, acrylic, polyimide, siloxane, a low-k material and the like may be used. In this embodiment mode, a silicon oxide film is formed as the first interlayer insulating layer (FIG. 4B).

Figure 4C:
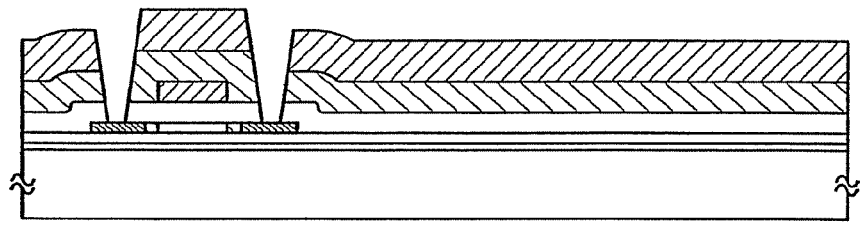

Next, contact holes that reach the semiconductor layer 52 are formed. The contact holes can be formed by etching to expose the semiconductor layer 52. The contact holes can be formed by either wet etching or dry etching. Further, they may be formed by etching one or more times depending on a condition. When etching is performed plural times, both wet etching and dry etching may be used (FIG. 4C).

Figure 4D:
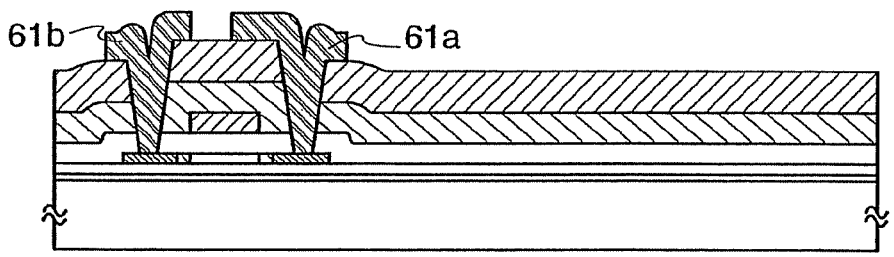

A conductive layer is formed to cover the contact holes and the first interlayer insulating layer 60. This conductive layer is processed into a desired shape to form a connection portion 61a, a wiring 61b and the like. These may have a single layer made from aluminum, copper or the like. In this embodiment mode, the conductive layer is formed by sequentially laminating molybdenum, aluminum and molybdenum. As a wiring having a laminated structure, a laminated structure of titanium, aluminum and titanium, or a laminated structure of titanium, titanium nitride, aluminum and titanium may be employed (FIG. 4D).

Figure 4E:
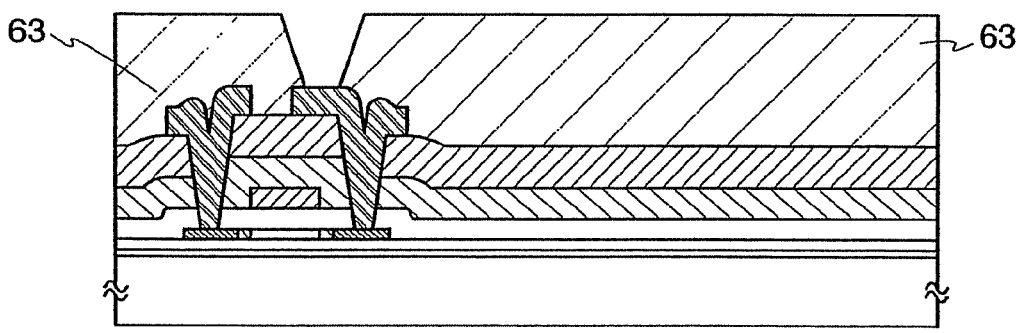

Thereafter, a second interlayer insulating layer 63 is formed to cover the connection portion 61a, the wiring 61b and the first interlayer insulating layer 60. As a material of the second interlayer insulating layer 63, a coating film such as acrylic, polyimide and siloxane having a self-planarizing property is preferably used. In this embodiment mode, siloxane is used as the second interlayer insulating layer 63 (FIG. 4E).

Subsequently, an insulating layer may be formed using silicon nitride or the like on the second interlayer insulating layer 63. This insulating layer is formed to prevent the second interlayer insulating layer 63 from being etched more than necessary when etching a pixel electrode that will be formed later. Therefore, when the ratio of the etching rates between the pixel electrode and the second interlayer insulating layer is large, this insulating layer may not be provided. A contact hole is formed through the second interlayer insulating layer 63 to reach the connection portion 61a.

A conductive layer is formed to cover the contact hole and the second interlayer insulating layer 63 (or the insulating layer). Thereafter, the conductive layer is processed to form a second electrode 106 of a thin-film light emitting element. The second electrode 64 is electrically connected to the connection portion 61a.

The second electrode 64 can be formed by using a conductive film, for example, metal having a conducting property such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr) and titanium (Ti); an alloy thereof; nitride of a metal material (e.g., TiN); metal oxide such as ITO (indium tin oxide), ITO containing silicon and IZO (indium zinc oxide) in which 2 to 20% zinc oxide (ZnO) is mixed in indium oxide; and the like.

Figure 5A:
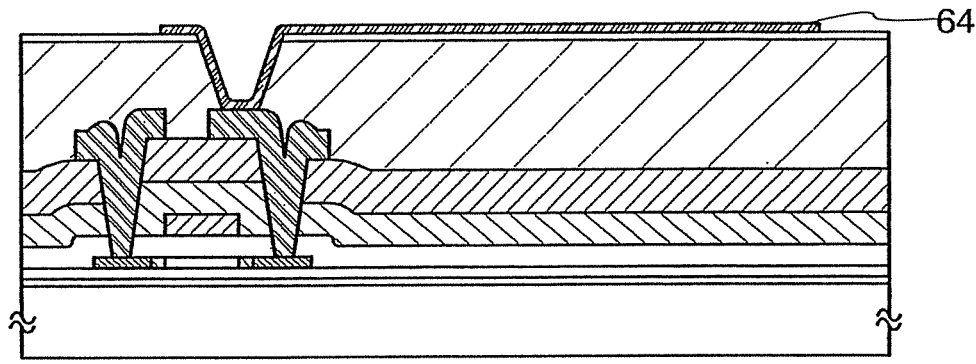
FIGS. 5A to 5C are cross sectional views showing steps of manufacturing a thin-film light emitting element according to the invention.

An electrode through which light is emitted may be formed using a conductive film having a light transmitting property. For example, metal oxide such as ITO indium tin oxide), ITO containing silicon, and IZO (indium zinc oxide) in which 2 to 20% zinc oxide (ZnO) is mixed in indium oxide can be used. In addition, an extremely thin film of metal such as Al and Ag can be used. When light is emitted through the first electrode, a material having high reflectance (e.g., Al, Ag and the like) can be used. In this embodiment mode, ITSO is used as the second electrode 64 (FIG. 5A).

Next, an insulating layer made from an organic material or an inorganic material is formed to cover the second interlayer insulating layer 63 (or the insulating layer) and the second electrode 64. Subsequently, the insulating layer is processed to expose a part of the second electrode 64 so as to form a partition wall 65. A photosensitive organic material (such as acrylic and polyimide) is preferably used as a material of the partition wall 65. Alternatively, a nonphotosensitive organic or inorganic material may be used for the partition wall.

Figure 5B:
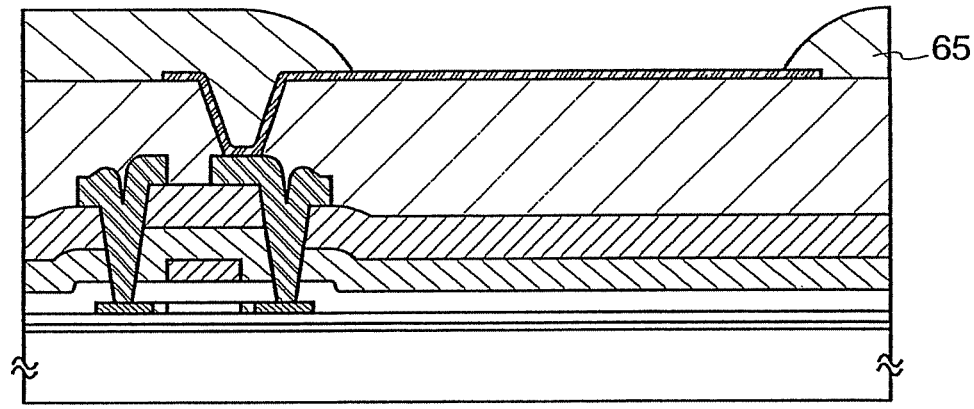
Figure 5C:
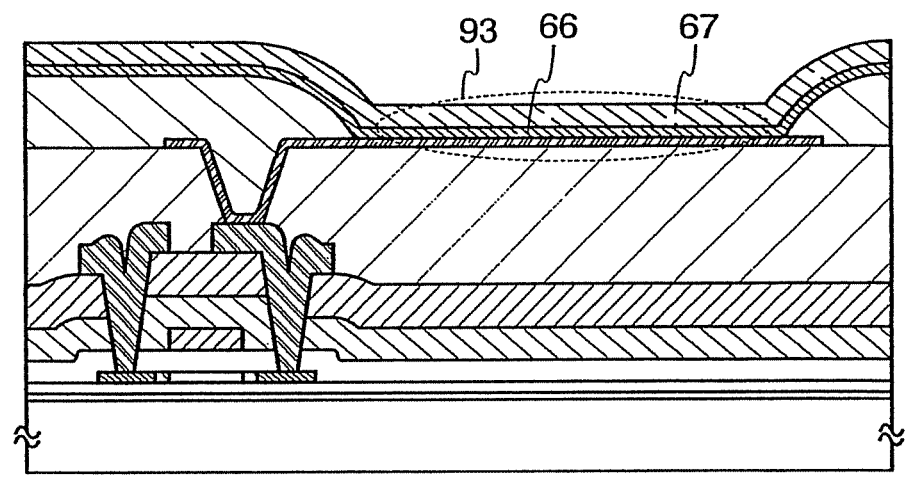

Further, a black pigment or a dye such as titanium black and carbon nitride may be dispersed in a material for the partition wall 65 using an dispersing agent so that the partition wall 65 is colored into black. This allows to use the partition wall as a black matrix. Preferably, an edge of the partition wall 65, where faces the second electrode, has a curvature and a taper shape such that the curvature is continuously varied (FIG. 5B).

Next, a second layer having a donor level, a layer having an acceptor level, a light emitting laminated body and a first layer having a donor level are sequentially laminated to cover the second electrode 64 exposed from the partition wall 65. These layers may be formed by evaporation.

The first layer having the donor level and the second layer having the donor level can be formed using different materials or a same material. These layers are formed using a layer that includes both a material with an electron transporting property and a material with an electron donating property that can donate electrons to the material with the electron transporting property, an N-type semiconductor layer, or a layer including an N-type semiconductor. For example, a material including a metal complex with quinoline skeleton or benzoquinoline skeleton such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), and bis(2-methyl-8-quinolinolato)-4-phenylphenolate-aluminum (abbreviation: BAlq) can be used as the material with the electron transporting property. In addition, a metal complex having oxazole ligand or thiazole ligand such as bis(2-[2-hydroxyphenyl]benzoxazolate)zinc (abbreviation: $Zn(BOX)_2$) and bis(2-[2-hydroxyphenyl]benzothiazolate)zinc (abbreviation: $Zn(BTZ)_2$) can be used. In addition to the metal complexes, the following substances can be used as the material with the electron transporting property: 2-(4-biphenylyl)-5-(4-tert-butylphenyl)-1,3,4-oxadiazole (abbreviation: PBD); 1,3-bis (5-[p-tert-butylphenyl]-1,3,4-oxadiazole-2-yl)benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); and the like. As the material with the electron donating property, which can donate electrons to these materials with the electron transporting properties, for example, alkali metal such as lithium and cesium, alkali earth metal such as magnesium and calcium, rare-earth metal such as erbium and ytterbium, an alloy containing such metal, a metallic compound and the like can be used. The material with the electron donating property, which can donate electrons, is selected depending on a combination with a material with an electron transporting property. In addition, a layer including the material with the electron transporting property and the material with the electron donating property may be mixed with metal oxide typified by Molybdenum oxide, zinc oxide, titanium oxide or the like. Furthermore, as the N-type semiconductor, zinc oxide, zinc sulfide, zinc selenide, titanium oxide and the like can be used.

Further, a layer including a plurality of materials such as the layer, which includes both a material with the electron transporting property and a material with the electron donating property, can be formed by forming respective materials at the same time. Concretely, the layer including the plurality of materials can be formed by combining same methods or different kinds of methods such as co-evaporation by resistive heating evaporation, co-evaporation by electron beam evaporation, co-evaporation by resistive heating evaporation and electron beam evaporation, a combination of resistive heating evaporation and sputtering, and a combination of electron beam evaporation and sputtering. Also, a layer including two kinds of materials is shown in the above described example; however, a layer including three or more materials can be formed in the same manner.

The mixture ratio (molar ratio) between the material with the electron transporting property and the material with the electron donating property, which can donate electrons to the material with the electron transporting property, is preferably about 1:0.5 to 1:2, and more preferably, 1:1. In the layer having the donor level in this embodiment mode, $Alq_3$ is used as the material with the electron, transporting property while lithium (Li) is used as the material with the electron donating property that can donate electrons to the $Alq_3$. The co-evaporation of $Alq_3$ and lithium is performed such that the $Alq_3$-lithium weight ratio satisfies 1:0.01. Further, the thickness of the layer having the donor level is set to be 10 nm.

The light emitting laminated body 104 may be formed to have a single layer or plural layers. An electron transporting layer may be provided between the light emitting layer of the light emitting laminated body 104 and the first electrode 101 and a hole transporting layer may be provided between a layer in which a light emitting material is dispersed and the layer 105 having the acceptor level. The electron transporting layer and the hole transporting layer may be provided or not be provided, and anyone of them may be provided. Since materials for the hole transporting layer and the electron transporting layer depend on the material with the hole transporting layer in the layer having the acceptor level and the material with the electron transporting layer in the layer having the donor level, and therefore, detailed explanation is omitted here. Please refer to respective descriptions.

Light emitting layers that can be applied to the light emitting laminated body 104 are largely classified into two types. One is a layer made from a material that has a larger energy gap than that of a light emitting substance, into which alight emitting material that becomes a luminescent center is dispersed. The other one is a layer only including a light emitting material. The former layer is preferable since concentration quenching is difficult to be caused. As the light emitting substance that becomes the luminescent center, for example, 4-dicyanomethylene-2-methyl-6-(1,1,7,7-tetramethyljulolidil-9-enyl)-4H-pyran (abbreviation: DCJT); 4-dicyanomethylene-2-t-butyl-6-(1,1,7,7-tetramethyljulolidil-9-enyl)-4H-pyran; periflanthene; 2,5-dicyano-1,4-bis(10-methoxy-1,1,7, 7-tetramethyljulolidil-9-enyl)benzene; N,N'-dimethylquinacridon (abbreviation: DMQd); coumarin 6; coumarin 545T; tris(8-quinolinolate)aluminum (abbreviation: $Alq_3$); 9,9'-bianthryl; 9,10-diphenylanthracene (abbreviation: DPA); 9,10-bis(2-naphthyl)anthracene (abbreviation: DNA); 2,5,8,11-tetra-t-butylperylene (abbreviation: TBP); 9,10-di(2-naphthyl)-2-tert-butylanthracene (abbreviation: t-BuDNA) and the like can be given. Also, as a host material into which the above-mentioned light emitting material is dispersed, for example, an anthracene derivative such as 9,10-di(2-naphthyl)-2-tert-butylanthracene (abbreviation: t-BuDNA); a carbazole derivative such as 4,4'-bis(N-carbazolyl)biphenyl (abbreviation: CBP); a metal complex such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)-4-phenylphenolate-aluminum (abbreviation: BAlq), bis(2-[2-hydroxyphenyl]pyridinato)zinc (abbreviation: $Znpp_2$) and bis(2-[2-hydroxyphenyl]benzoxazolato)zinc (abbreviation: ZnBOX); and the like can be used. Furthermore, as a light emitting substance that can constitute the light emitting laminated body 104 by itself, tris(8-quinolinolato)aluminum (abbreviation: $Alq_3$), 9,10-bis(2-naphthyl)anthracene (abbreviation: DNA), bis(2-methyl-8-quinolinolato)-4-phenylphenolate-aluminum (abbreviation: BAlq), and the like can be given.

In this embodiment mode, as the light emitting laminated body 104, a hole transporting layer, a light emitting layer in which a light emitting material is dispersed, and an electron transporting layer are sequentially laminated over the layer 105 having the acceptor level. As the hole transporting layer, α-NPD is evaporated to have a thickness of 10 nm. As the layer in which a light emitting material is dispersed, $Alq_3$ and coumarin 6 are evaporated to have a thickness of 35 nm such that the $Alq_3$-coumarin 6 ratio satisfies 1:0.005. As the electron transporting layer, $Alq_3$ is evaporated to have a thickness of 10 nm.

The layer 105 having the acceptor level can be formed using a layer including both a material with a hole transporting property and a material with an electron accepting property that can accept electrons from the material with the hole transporting property, a P-type semiconductor layer, or a layer including a P-type semiconductor. As the material with the hole transporting property, for example, an aromatic amine (i.e., which has a benzene ring-nitrogen bond) compound such as 4,4-bis(N-[1-naphthyl]-N-phenyl-amino)-biphenyl (abbreviation: α-NPD), 4,4'-bis(N-[3-methylphenyl]-N-phenyl-amino)-biphenyl (abbreviation: TPD), 4,4',4"-tris (N,N-diphenyl-amino)-triphenylamine (abbreviation: TDATA), 4,4',4"-tris(N-[3-methylphenyl]-N-phenyl-amino)-triphenylamine (abbreviation: MTDATA), and 4,4'-bis(N-(4-[N,N-di-m-tolylamino]phenyl)-N-phenylamino) biphenyl (abbreviation: DNTPD); a phthalocyanine compound such as phthalocyanine (abbreviation: $H_2Pc$), copper phthalocyanine (abbreviation: CuPc) and vanadyl phthalocyanine (abbreviation: VOPc) can be used. Also, as the material with the electron accepting property, which can accept electrons from the material with the hole transporting property, for example, molybdenum oxide, vanadium oxide, 7,7,8,8-tetracyanoquinodimethane (abbreviation: TCNQ), 2,3-dicyano naphthoquinone (abbreviation: DCNNQ), 2,3,5,6-tetrafluoro-7,7,8,8-tetracyanoquinodimethane (abbreviation: F4-TCNQ), and the like can be given. Further, the material with the electron accepting property, which can accept electrons, is selected depending on a combination with a material with a hole transporting property. As the P-type semiconductor, molybdenum oxide, vanadium oxide; ruthenium oxide, cobalt oxide, nickel oxide, copper oxide or the like can be used. Further, the materials mentioned here are just examples. An operator can arbitrarily select materials. The mixture ratio (molar ratio) of the material with the hole transporting property to the material with the electron accepting property, which can accept electrons from the hole transporting property, is preferably 0.5 or more, and more preferably, 0.5 to 2. In the first layer having the acceptor level and the second layer having the acceptor level of this embodiment mode, α-NPD is used as the material with the electron transporting property and molybdenum oxide (MoOx) is used as the material with the electron accepting property that can accept electrons from the α-NPD. There layers are formed such that the weight ratio between α-NPD and MoOx satisfies 4:0.2 (which corresponds to 1:1 in the molar ratio). Furthermore, the thickness of the first layer having the acceptor level is set to be 50 nm whereas the thickness of the second layer having the acceptor level is set to be 20 nm in this embodiment mode.

Further, a layer including a plurality of materials such as the layer, which includes both a material with the electron transporting property and a material with the electron donating property, can be formed by forming respective materials at the same time. Concretely, the layer including the plurality of materials can be formed by combining same methods or different kinds of methods such as co-evaporation by resistive heating evaporation, co-evaporation by electron beam evaporation, co-evaporation by resistive heating evaporation and electron beam evaporation, a combination of resistive heating evaporation and sputtering, and a combination of electron beam evaporation and sputtering. Also, a layer including two kinds of materials is shown in the above described example; however, a layer including three or more materials can be formed in the same manner.

Light emitting layers having different light emission wavelength bands may be formed in each pixel so as to perform color display. Typically, light emitting layers corresponding to respective luminescent colors of R (red), G (green) and B (blue) are formed. In this case, when a filter (colored layer) that transmits light of a certain light emission wavelength band is provided at a side through which light emitted from pixels passes, color purity can be improved and specular reflexion (reflection) of a pixel portion can be prevented. By providing the filter (colored layer), a circular polarizing plat or the like, which has been conventionally required, can be eliminated, thereby reducing loss of light emitted from the light emitting element. Also, changes in color tone, that are caused in the case where a pixel portion (a display screen) is seen obliquely, can be reduced.

A light emitting element can emit monochromatic light or white light. When using a white light emitting material, a color display can be achieved by providing filters (colored layers) each transmits light of a certain wavelength at a side through which light emitted from pixels passes.

In order to form a light emitting layer that emits white light, for example, white light emission can be obtained by sequentially laminating $Alq_3$, $Alq_3$ partially doped with Nile red, $Alq_3$, p-EtTAZ and TPD (aromatic diamine) by using evaporation.

Further, a triplet excited light emitting substance including a metal complex and the like may be used for a light emitting layer in addition to a singlet excited light emitting substance. For example, pixels emitting red light of which half-life period of the luminance is relatively shorter than pixels emitting green and blue light are formed by a triplet excited light emitting substance, and the pixels emitting green and blue light are formed by singlet excited light emitting substances. Since the triplet excited light emitting material has an excellent light emitting efficiency, it has a feature of requiring low power consumption in order to obtain a same level of luminance as compared with the singlet excited light emitting substances. That is, when the pixels for emitting red light are formed by the triplet excited light emitting material, a small amount of current flowing through the light emitting element is required, thereby improving the reliability. To reduce power consumption, in turn, pixels emitting red light and green light may be formed of the triplet excited light emitting materials, while pixels emitting blue light may be formed of a singlet excited light emitting material. In the case where light emitting elements that emit green light, which has high visibility with respect to human eyes, are also formed of the triplet excited light emitting material, power consumption can be further reduced.

As an example of the triplet excited light emitting substances, there is one that uses a metal complex as a dopant. In particular, a metal complex with platinum, which is a third transition element, as its central metal, a metal complex with iridium as its central metal and the like are known. The triplet excited light emitting substances are not limited to these compounds, and it is possible to employ a compound having an above-mentioned structure and including an element that belongs to groups 8 to 10 of the periodic table as its central metal.

When a light emitting element formed of the above-mentioned materials is applied with a forward bias voltage, it can emit light. Each pixel of a display device formed using the light emitting element can be driven by either a simple matrix method or an active matrix method. In either case, individual pixels emit light by being applied with a forward bias voltage at a certain timing, whereas individual pixels do not emit light in a certain period. In this non-light emitting period, a reverse bias voltage is applied to the light emitting element so that the reliability of the light emitting element can be improved. The light emitting element has deterioration modes of reducing light intensity under a certain driving condition or reducing appearance luminance due to expansion of a non-light emitting region within pixels. When the light emitting element is driven by applying alternating current to apply a forward bias voltage and a reverse bias voltage alternately, the deteriorations of the light emitting element can be reduced, thereby increasing the reliability of the light emitting device.

Subsequently, the first electrode 67 is formed to cover a layer having a donor level. Thus, a light emitting element 93 including the first electrode 67, the light emitting body and the second electrode 64 can be manufactured. As a cathode material used for forming the first electrode 67, metal, an alloy, an electrically conducting compound or a mixture thereof with a low work function (work function is 3.8 eV or less) is preferably used. As specific examples of the materials, an element belonging to group 1 or 2 of the periodic table, i.e., alkali metal such as Li and Cs, alkali earth metal such as Mg, Ca, and Sr; an alloy including these elements (Mg:Ag, Al:Li or the like); a compound including these elements (LiF, CsF, $CaF_2$ or the like) can be given. Also, the first electrode can be formed using transition metal containing rare earth metal. In addition, these materials can be formed by being laminated with metal (including an alloy) such as Al, Ag and ITO. In this embodiment mode, aluminum is used as the first electrode.

In the light emitting device having the above described structure, since the second layer having the donor level is formed in contact with the second electrode, a material for the second electrode can be selected without any regard for a work function. Therefore, when selecting a material of the second electrode, the range of choice for the material can be widened. Consequently, a material suitable for the structure of the light emitting device can be used.

Further, in this embodiment mode, the second electrode 64 is electrically connected to the connection portion 61a. Alternatively, the first electrode 67 may be formed being electrically connected to the connection portion 61a. In this case, the first layer having the donor level, the light emitting laminated body, the layer 105 having the acceptor level, and the second layer having the donor level may be sequentially laminated over the first electrode 67.

Afterwards, a silicon oxide film containing nitrogen is formed by plasma CVD as a second passivation film. When using the silicon oxide film containing nitrogen, a silicon oxynitride film may be formed using $SiH_4$, $N_2O$ and $NH_3$, or a silicon oxynitride film may be formed using $SiH_4$ and $N_2O$, or a silicon oxynitride film may be formed using a gas in which $SiH_4$ and $N_2O$ are diluted with Ar, by plasma CVD.

Also, as a first passivation film, a hydrogenated silicon oxynitride film formed using $SiH_4$, $N_2O$ and $H_2$ may be used. The first passivation film is, of course, not limited to a single layer structure, and the first passivation film may have other single layer structure of an insulating layer containing silicon or a laminated structure. In addition, a multilayer film including a carbon nitride film and a silicon nitride film, a multilayer film including styrene polymer, a silicon nitride film, or a diamond like carbon film may be formed instead of the silicon oxide film containing nitrogen.

Subsequently, to protect the light emitting element from a substance that promote deterioration of the light emitting element such as moisture, a display portion is sealed. When the display portion is sealed with a counter substrate, the counter substrate is adhered to the display portion with an insulating sealing material such that an external connection portion is exposed. An inert gas such as dried nitrogen may be filled in a space between the counter substrate and the element substrate. Alternatively, a sealing material may be applied over the entire surface of the pixel portion and then the counter substrate may be attached thereto. Ultraviolet curing resin or the like is preferably used as the sealing material. A drying agent or a particle for maintaining a constant gap between the substrates may be mixed in the sealing material. Subsequently, a flexible wiring substrate is attached to the external connection portion so as to complete a display device.

Examples of structures of display devices manufactured above will be described with reference to FIGS. 6A and 6B. Further, portions having same functions are sometimes denoted by same reference numerals, though they have different shapes so as to omit explanations. In this embodiment mode, the thin film transistor 70 having an LDD structure is connected to the light emitting element 93 through the connection portion 61a.

Figure 6A:
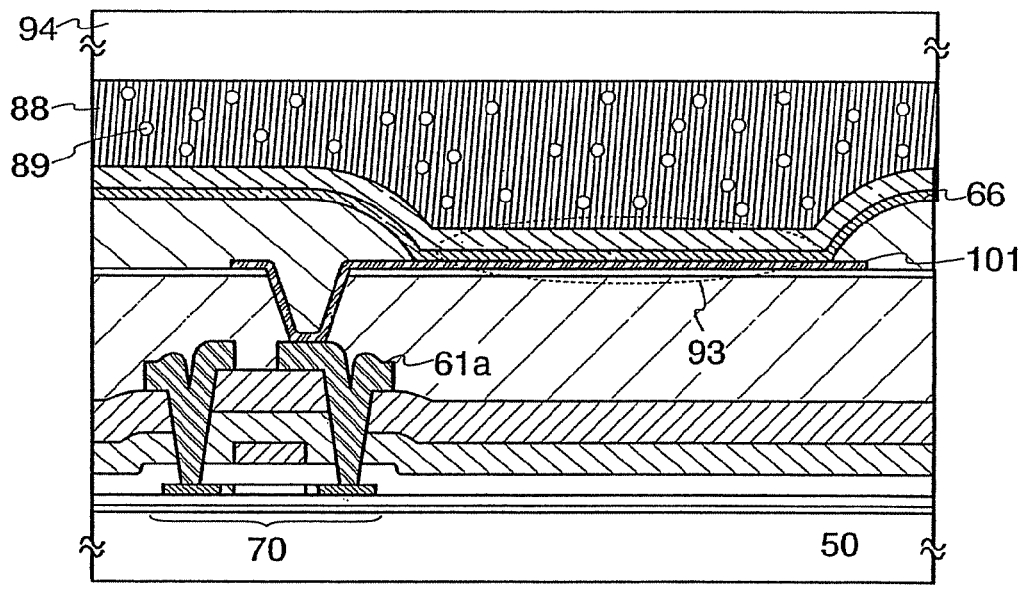
FIGS. 6A and 6B are cross sectional views showing structures of display devices.

FIG. 6A shows a structure where the first electrode 101 is formed using a conductive film with a light transmitting property, and light generated in the light emitting body 66 is emitted toward the substrate 50. Further, reference numeral 94 represents a counter substrate. This counter substrate is firmly attached to the substrate 50 using a sealing material or the like after forming the light emitting element 93. Resin 88 having a light transmitting property or the like is filled between the counter substrate 94 and the element to seal the light emitting element 93. Accordingly, the light emitting element 93 can be prevented from being deteriorated by moisture or the like. Preferably, the resin 88 has a hygroscopic property. More preferably, to prevent the adverse influence of moisture, a drying agent 89 with a high light transmitting property is dispersed in the resin 88.

Figure 6B:
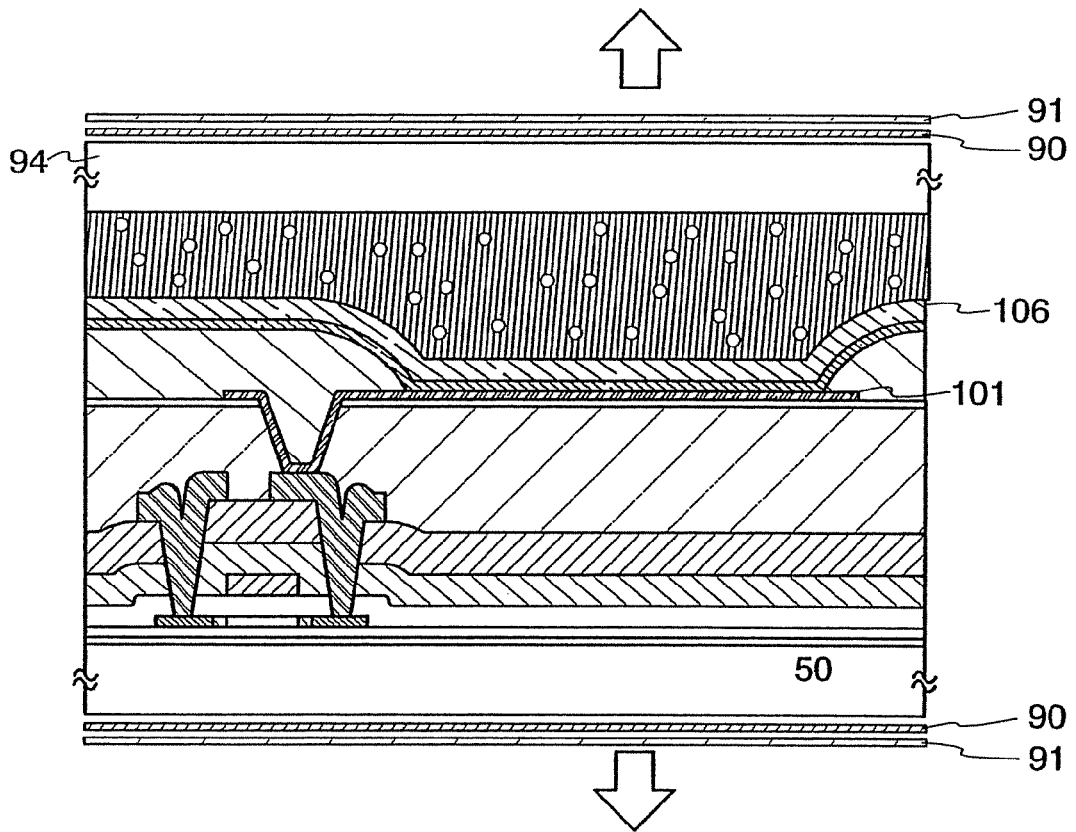

FIG. 6B shows a structure, wherein both the first electrode 101 and the second electrode 106 are formed using conductive films having light transmitting properties and light generated in the light emitting laminated body 66 can be emitted toward both the substrate 50 and the counter substrate 94. In this structure, by providing polarizing plates 90 outside of the substrate 50 and the counter substrate 94, a screen can be prevented from being transparent, thereby improving visibility. Protection films 91 may be provided outside of the polarizing plates 90.

The display device having a display function may employ either a analog video signal and a digital video signal. If a digital video signal is used, the video signal may use either a voltage or a current. When the light emitting element emits light, a video signal input to a pixel may have either a constant voltage or a constant current. When a video signal has a constant voltage, a constant voltage is applied to a light emitting element or a constant current flows through the light emitting element. Also, when a video signal has a constant current, a constant voltage is applied to a light emitting element or a constant current flows through the light emitting element. A driving method where a constant voltage is applied to a light emitting element is called a constant voltage drive. Meanwhile, a driving method where a constant current flows through a light emitting element is called a constant current drive. According to the constant current drive, constant current flows regardless of changes in resistance of a light emitting element. The light emitting display device according to the present invention and the driving method thereof may use the above mentioned methods.

In the display device of the present invention formed according to the present embodiment mode, a material for the second electrode 106 can be selected without any regard for a work function. When selecting a material for the second electrode 106, the range of choice for the material can be widened. As a consequence, a material that is suitable for a structure of the light emitting element can be used.

The present embodiment mode can be used by being freely combined with Embodiment Modes 1 through 4.

Embodiment Mode 6

Figure 7A:
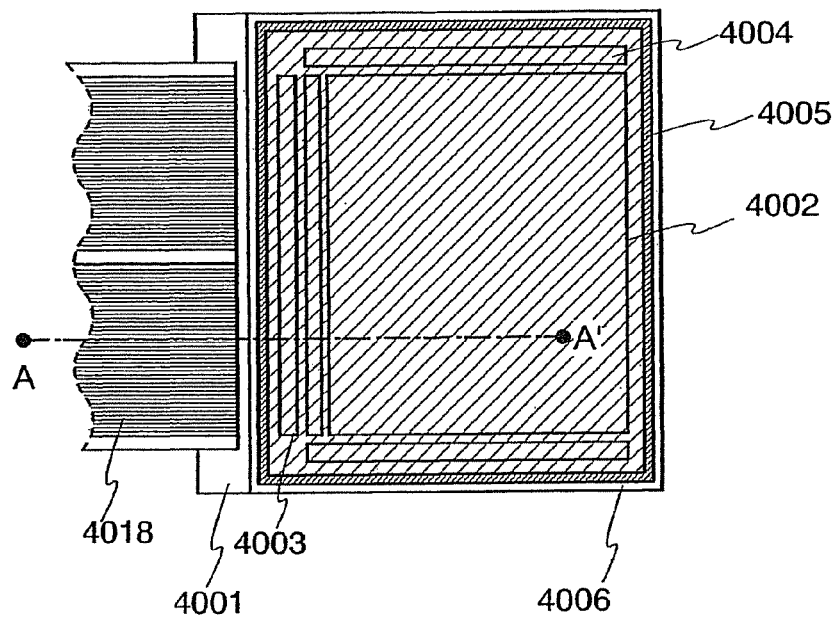
FIG. 7A is a top view and FIG. 7B is a cross sectional view of a light emitting device according to the invention.
Figure 7B:
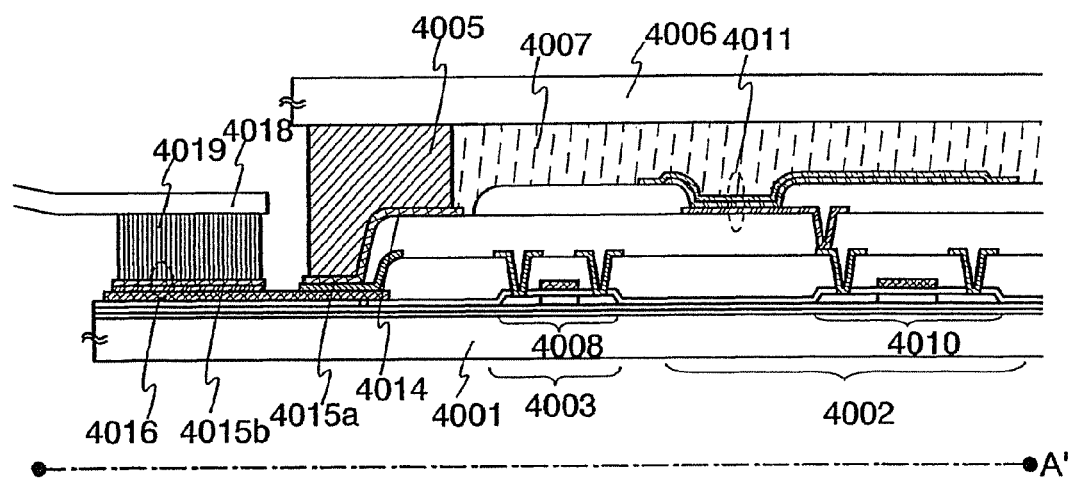

An outer appearance of a light emitting device corresponding to one mode of the invention will be described in this embodiment mode with reference to FIGS. 7A and 7B. FIG. 7A is a top view of a panel in which a transistor and a light emitting element formed over a substrate are sealed with a sealing material that is formed between the substrate and a counter substrate 4006. FIG. 7B is a cross sectional view of FIG. 7A. The light emitting element mounted on this panel has a structure in which layers contacting to electrodes are layers having a donor level and a light emitting laminated body and a layer having an acceptor level are sandwiched between the layers having the donor level.

A sealing material 4005 is provided so as to surround a pixel portion 4002, a signal line driver circuit 4003 and a scanning line driver circuit 4004 that are provided over a substrate 4001. The counter substrate 4006 is provided over the pixel portion 4002, the signal line driver circuit 4003 and the scanning line driver circuit 4004. Thus, the pixel portion 4002, the signal line driver circuit 4003 and the scanning line driver circuit 4004 are hermetically sealed with the substrate 4001, the sealing material 4005 and the counter substrate 4006 along with a filler 4007.

The pixel portion 4002, the signal line driver circuit 4003 and the scanning line driver circuit 4004, which are provided over the substrate 4001, have, a plurality of transistors. In FIG. 7B, a thin film transistor 4008 included in the signal line driver circuit 4003 and a thin film transistor 4010 included in the pixel portion 4002 are shown.

Further, a light emitting element 4011 is electrically connected to the thin film transistor 4010.

Also, a leading wiring 4014 corresponds to a wiring for supplying signals or a power supply voltage to the pixel portion 4002, the signal line driver circuit 4003 and the scanning line driver circuit 4004. The leading wiring 4014 is connected to a connection terminal 4016 through a leading wiring 4015a and a leading wiring 4015b. The connection terminal 4016 is electrically connected to a terminal included in a flexible printed circuit (FPC) 4018 through an anisotropic conductive film 4019.

Further, as the filler 4007, ultraviolet curing resin or heat curing resin can be used in addition to an inert gas such as nitrogen and argon. For example, polyvinyl chloride, acrylic, polyimide, epoxy resin, silicon resin, polyvinyl butyral, or ethylene vinylene acetate can be used.

Furthermore, the light emitting device of the present invention includes a panel in which a pixel portion having a light emitting element is formed and a module in which an IC is mounted on the panel.

In the panel and the module having the structure of the present embodiment mode, a material for the second electrode can be selected without any regard for a work function. When selecting a material for the second electrode, the range of choice for the material can be widened. Consequently, a material that is suitable for a structure of a light emitting device and a required performance can be used, making it possible to manufacture a panel and a module having high display quality, easily.

The present embodiment mode can be implemented by being freely combined with Embodiment Mode 1 through 5.

Embodiment Mode 7

As electronic appliances mounted with the modules as shown in Embodiment Mode 6, a camera such as a video camera and a digital camera; a goggle type display (a head mounted display); a navigation system; an audio reproducing device (e.g., a car audio component); a computer; a game machine; a portable information terminal (e.g., a mobile computer, a cellular phone, a portable game machine, an electronic book and the like); an image reproducing device equipped with a recording medium (concretely, a device having a display that can reproduce a recording medium such as a digital versatile disc (DVD) and can display an image thereof); and the like can be given. Specific examples of these electronic appliances are shown in FIGS. 8A to 8E.

FIG. 8A shows a light emitting display device such as a monitor screen of a television or a personal computer. The light emitting display device comprises a housing 2001, a display portion 2003, speaker portions 2004 and the like. In the light emitting display device of the invention, as an electrode of a light emitting element included in the display portion 2003, a material that is suitable for a structure of the light emitting element and a required performance can be used, and hence, the light emitting display device has high display quality. To improve the contrast, a polarizing plate or a circular polarizing plate may be provided in the pixel portion. For example, a $\frac{1}{4}\lambda$ plate, a $\frac{1}{2}\lambda$ plate and a polarizing plate are preferably provided over a sealing substrate in this order. In addition, an antireflection film may be provided on the polarizing plate.

FIG. 8B shows a cellular phone, comprising a main body 2101, a housing 2102, a display portion 2103, an audio input portion 2104, an audio output portion 2105, operation keys 2106, an antenna 2108 and the like. In the cellular phone according to the present invention, as an electrode of a light emitting element included in the display portion 2103, a material that is suitable for a structure of the light emitting element and a required performance can be used, and hence, the cellular phone has high display quality.

FIG. 8C shows a laptop computer, comprising a main body 2201, a housing 2202, a display portion 2203, a keyboard 2204, an external connection port 2205, a pointing mouse 2206 and the like. In the laptop computer according to the invention, as an electrode of a light emitting element included in the display portion 2203, a material that is suitable for a structure of the light emitting element and a required performance can be used, and hence, the laptop computer has high display quality. Although the laptop computer is shown in FIG. 8C, the present invention can be applied to a desktop computer where a hard disk and a display portion are combined, and the like.

FIG. 8D shows a mobile computer, comprising a main body 2301, a display portion 2302, a switch 2303, operation keys 2304, an infrared port 2305 and the like. In the mobile computer according to the invention, as an electrode of a light emitting element included in the display portion 2302, a material that is suitable for a structure of the light emitting element and a required performance can be used, and hence, the mobile computer has a high display quality.

FIG. 8E shows a portable game machine, comprising a housing 2401, a display portion 2402, speaker portions 2403, operation keys 2404, a recording medium insertion portion 2405 and the like. In the portable game machine according to the invention, as an electrode of a light, emitting element included in the display portion 2402, a material that is suitable for a structure of the light emitting element and a required performance can be used, and hence, the portable game machine has a high display quality.

As set forth above, the application range of the present invention is extremely wide so that the present invention can be used for electronic appliances in various fields.

Embodiment Mode 8

Figure 9A:
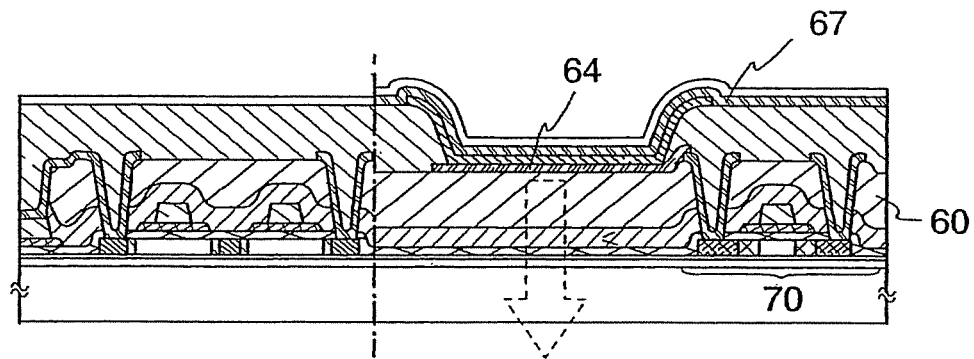
FIGS. 9A to 9C are cross sectional views showing examples of structures for display devices.
Figure 9B:
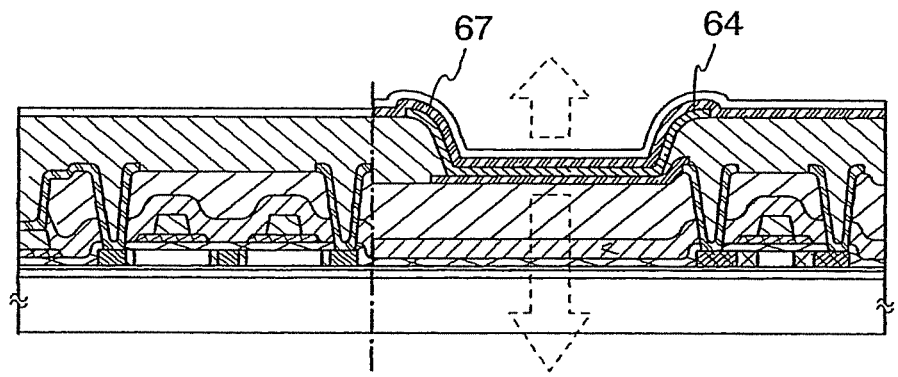
Figure 9C:
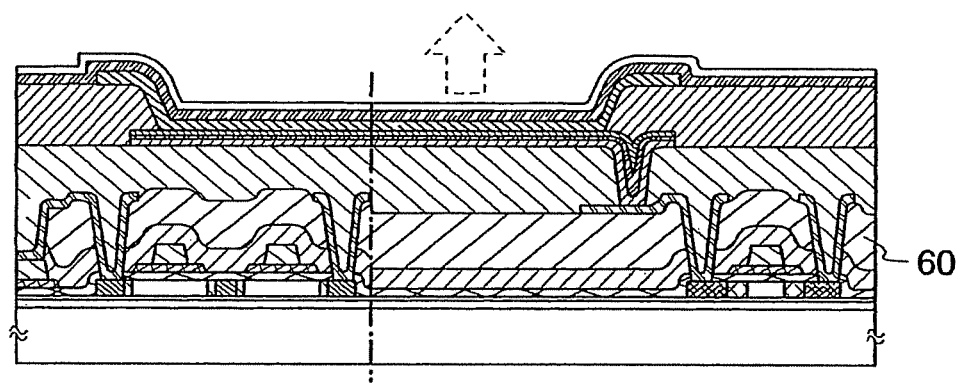

Examples of a bottom emission, a dual emission and a top emission are shown in FIGS. 9A to 9C. The structure of Embodiment Mode 2, in which the manufacturing process is described, corresponds to a structure of FIG. 9C. FIGS. 9A and 9B have a structure in which a first interlayer insulating layer 900 of FIG. 9C is formed using a material having a self-planarizing property and a wiring that connects to a thin film transistor 901 and a first electrode 101 of a light emitting element are formed on the same interlayer insulating layer. In FIG. 9A, only the first electrode 101 of the light emitting element is formed using a material with a light transmitting property so that light is emitted toward a bottom portion of the light emitting device (i.e., bottom emission). In FIG. 9B, a second electrode 106 is also formed using a material with a light transmitting property such as ITO, ITSO and IZO, making it possible to obtain a light emitting display device that can emit light toward both sides (i.e., dual emission). Furthermore, when an electrode is formed using a thick film of aluminum, silver or the like, the electrode does not transmit light. However, when an electrode is formed using a thin film of aluminum, silver or the like, it can transmit light. Accordingly, when the second electrode 106 is formed using a thin film of aluminum or silver that has a light transmitting property, a light emitting display device that can emit both upward and downward can be obtained.

Embodiment Mode 9

Pixel circuits and protection circuits included in the panel and module as described in Embodiment Mode 6, and operations thereof will be described in this embodiment mode. Further, the cross sectional views as shown in FIGS. 4A to 4E and FIGS. 5A to 5C corresponds to a cross sectional view of a driving TFT 1403 and a light emitting element 1405.

Figure 10A:
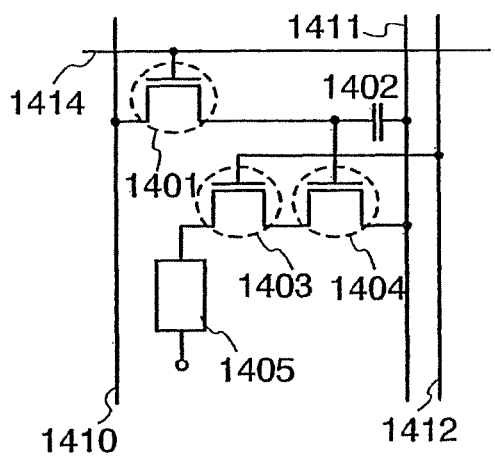
FIGS. 10A to 10F are diagrams showing examples of pixel circuits for display devices.

In a pixel as shown in FIG. 10A, a signal line 1410, power supply lines 1411 and 1412 are arranged in columns, whereas a scanning line 1414 is arranged in a row. The pixel also includes a switching TFT 1401, a driving TFT 1403, a current controlling TFT 1404, a capacitor element 1402 and a light emitting element 1405.

Figure 10B:
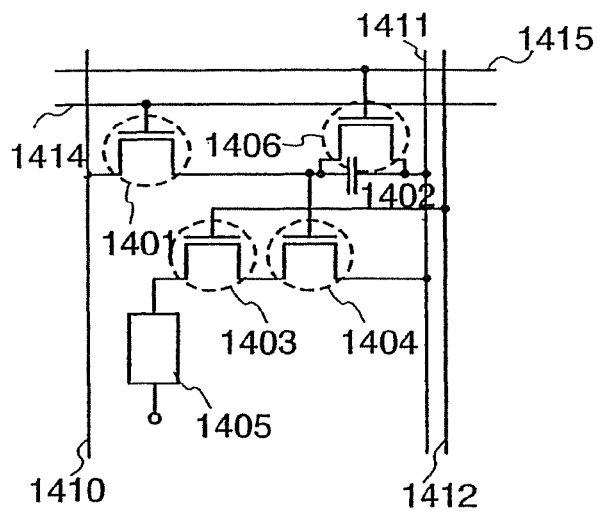
Figure 10C:
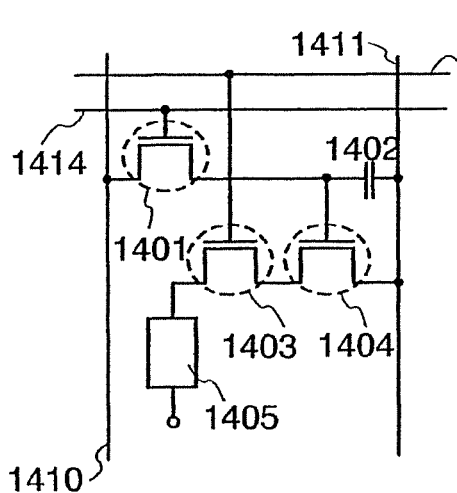
Figure 10D:
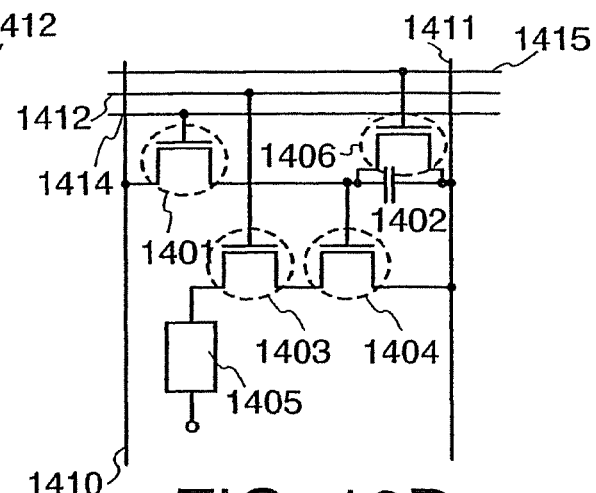

A pixel as shown in FIG. 10C has a similar structure to the one shown in FIG. 10A, except that a gate electrode of the driving TFT 1403 is connected to a power supply line 1412 that is arranged in a row. That is, both pixels depicted in FIGS. 10A and 10C show similar equivalent circuit diagrams. However, respective power supply lines are formed of conductive layers in different layers between the case where the power supply line 1412 is arranged in a column (FIG. 10A) and the case where the power supply line 1412 is arranged in a row (FIG. 10C). In order to emphasis on the different arrangements of the power supply lines to which the gate electrodes of the driving TFTs 1403 are connected, the equivalent circuit diagrams are individually illustrated in FIGS. 10A and 10C.

In each pixel as shown in FIGS. 10A and 10C, the driving TFT 1403 and the current controlling TFT 1404 are connected in series in each pixel, and the channel length L (1403) and the channel width W (1403) of the driving TFT 1403 and the channel length L (1404) and the channel width W (1404) of the current controlling TFT 1404 are set to satisfy the relation of L (1403)/W (1403):L (1404)/W (1404)=5 to 6,000:1.

The driving TFT 1403 is operated in a saturation region and controls the amount of current flowing through the light emitting element 1405, whereas the current controlling TFT 1404 is operated in a linear region and controls current supplied to the light emitting element 1405. The both TFTs 1403 and 1404 preferably have a same conductivity type in view of the manufacturing process, and n-channel TFTs are formed as the TFTs 1403 and 1404 in this embodiment mode. Also, a depletion type TFT may be used as the driving TFT 1403 instead of an enhancement type TFT. According to the invention having the above structure, slight variations in $V_{gs}$ of the current controlling TFT 1404 does not adversely affect the amount of current flowing through the light emitting element 1405, since the current controlling TFT 1404 is operated in a linear region. That is, the amount of current flowing through the light emitting element 1405 can be determined by the driving TFT 1403 operated in the saturation region. Accordingly, it is possible to provide a display device in which image quality is improved by improving variations in luminance of the light emitting element due to variation of the TFT characteristics.

The switching TFT 1401 of each pixel as shown in FIGS. 10A to 10F controls a video signal input with respect to the pixel. When the switching TFT 1401 is turned on and a video signal is input in the pixel, a voltage of the video signal is held in the capacitor element 1402. Although the arrangement in which each pixel includes the capacitor element 1402 are shown in FIGS. 10A and 10C, the invention is not limited thereto. When a gate capacitance or the like can serve as a capacitor for holding a video signal, the capacitor element 1402 may not be provided.

A pixel as shown in FIG. 10B has a similar structure to the one shown in FIG. 10A, except that a TFT 1406 and a scanning line 1414 are added thereto. Similarly, a pixel as, shown in FIG. 10D has a similar structure to the one shown in FIG. 10C, except that a TFT 1406 and a scanning line 1415 are added thereto.

The TFT 1406 is controlled to be turned on/off by the newly provided scanning line 1415. When the TFT 1406 is turned on, the charge held in the capacitor element 1402 are discharged, thereby turning the current controlling TFT 1404 off. That is, supply of current flowing through the light emitting element 1405 can be forcibly stopped by providing the TFT 1406. Therefore, the TFT 1406 can also referred to as an erasing TFT. A lighting period can start simultaneously with or immediately after a writing period starts before signals are written into all the pixels according to the structures shown in FIGS. 10B and 10D, and hence, the duty ratio can be improved.

Figure 10E:
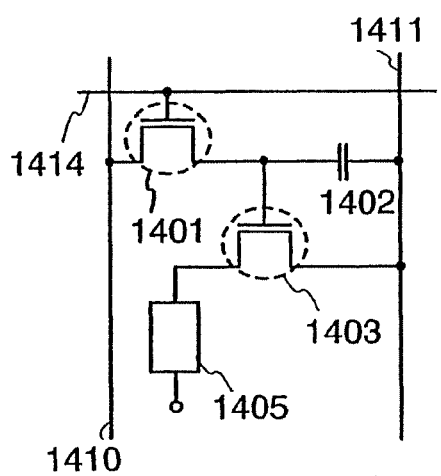
Figure 10F:
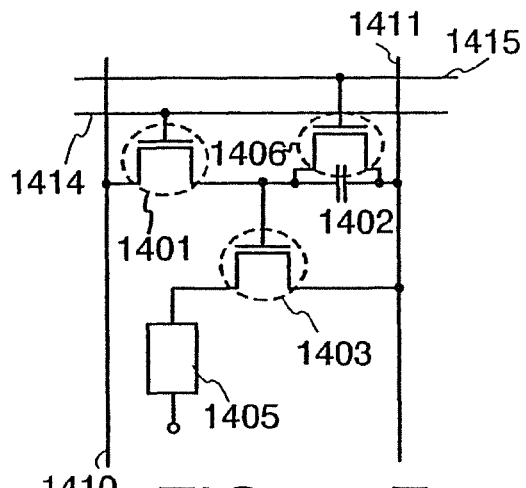

In a pixel as shown in FIG. 10E, a signal line 1410 and a power supply line 1411 are arranged in columns while a scanning line 1414 is arranged in a row. The pixel further includes a switching TFT 1401, a driving TFT 1403, a capacitor element 1402 and a light emitting element 1405. A pixel shown in FIG. 10F has a similar structure to the one shown in FIG. 10E, except that a TFT 1406 and a scanning line 1415 are added thereto. Further, the structure as shown in FIG. 10F also allows a duty ratio to be improved by providing the TFT 1406.

As set forth above, various types of pixel circuits can be employed. In particular, when forming a thin film transistor using an amorphous semiconductor film, the area of a semiconductor film for the driving TFT 1403 is preferably enlarged. Therefore, a top emission type in which light generated in an electroluminescent layer is emitted through a sealing substrate is preferably employed in the above pixel circuits.

In an active matrix light emitting device as mentioned above, TFTs are provided in each pixel. Therefore, when the pixel density is increased, the active matrix light emitting device is favorable since it can be driven at low voltage.

The active matrix light emitting device where respective TFTs are provided in each pixel is described in this embodiment mode. Alternatively, a passive matrix light emitting device where ON/OFF is controlled for each column can be formed. Since the TFTs are not provided in each pixel in the passive matrix light emitting device, the high aperture ratio is obtained. In the case of a with a passive matrix light emitting device in which light generated in an electroluminescent layer is emitted toward both sides of the electroluminescent layer, the aparture-ratio is improved.

In a display device of the present invention having such a pixel circuit, as an electrode of a light emitting element included in this display device, a material that is suitable for a structure of the light emitting element and a required performance can be used. In addition, the display device can have the above described respective characteristics.

Subsequently, a case where diodes are provided as protection circuits in the scanning line and the signal line will be described with reference to the equivalent circuit diagram as shown in FIG. 10E.

Figure 11:
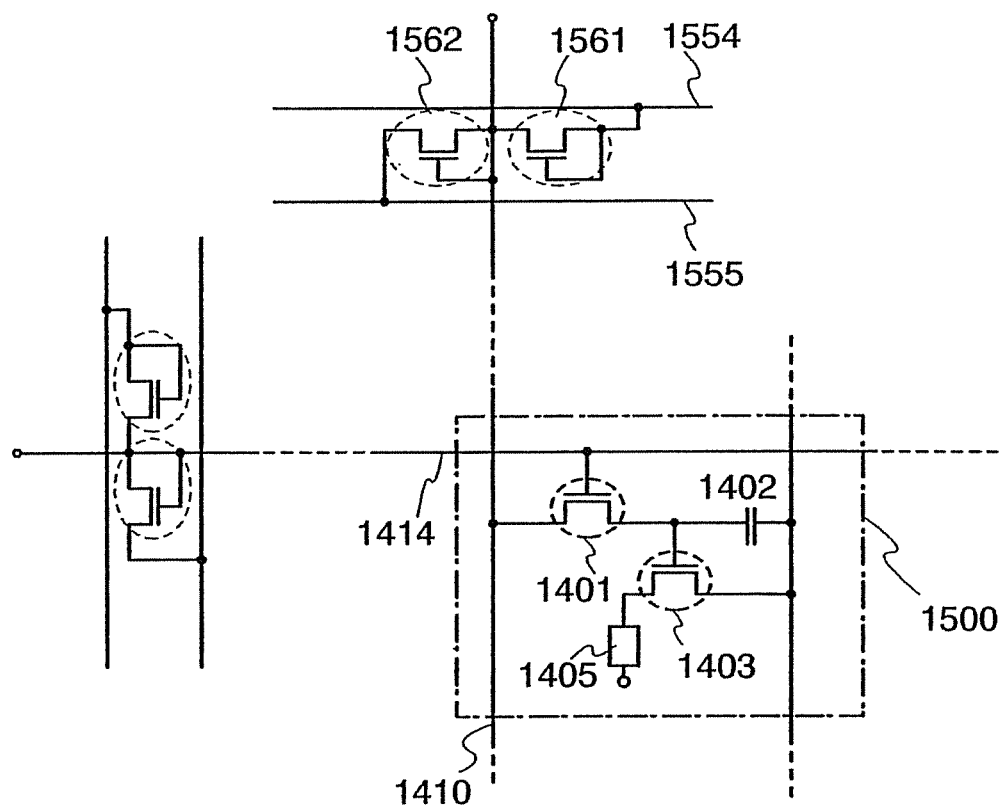
FIG. 11 is a diagram showing an example of a protection circuit for a display device.
Figure 12:
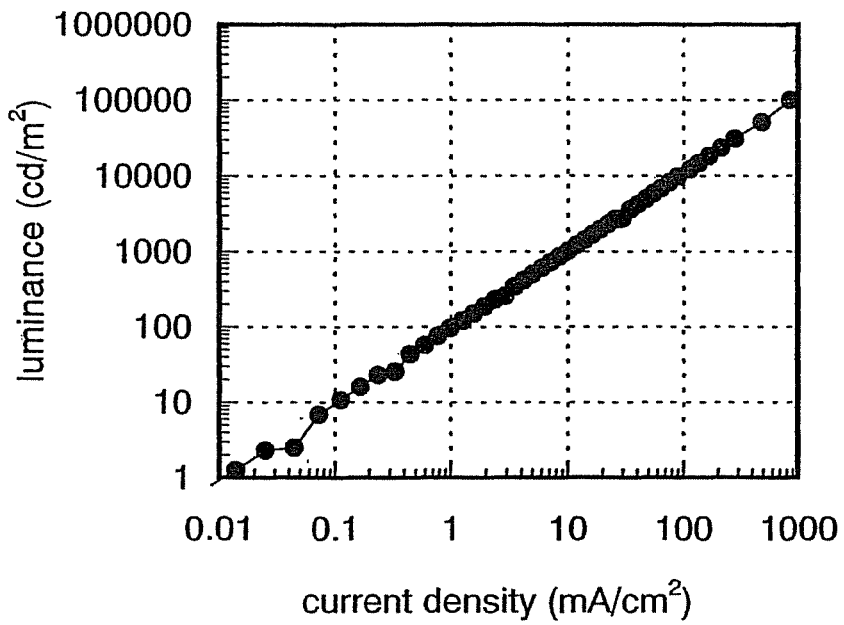
FIG. 12 is a graph showing a current density-luminance curve of an element (green) as shown in FIG. 2B.
Figure 13:
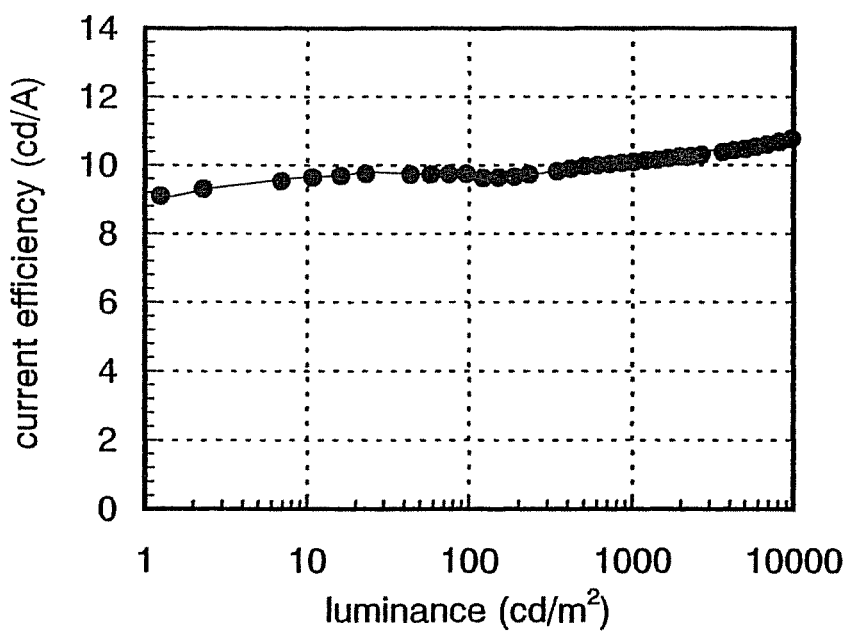
FIG. 13 is a graph showing a luminance-current efficiency curve of the element (green) as shown in FIG. 2B.
Figure 14:
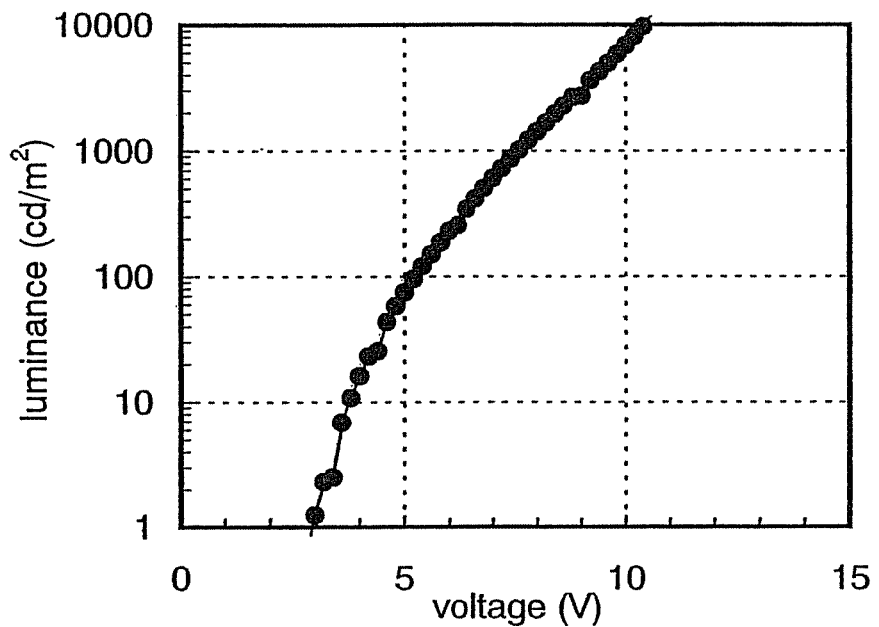
FIG. 14 is a graph showing a voltage-luminance curve of the element (green) as shown in FIG. 2B.
Figure 15:
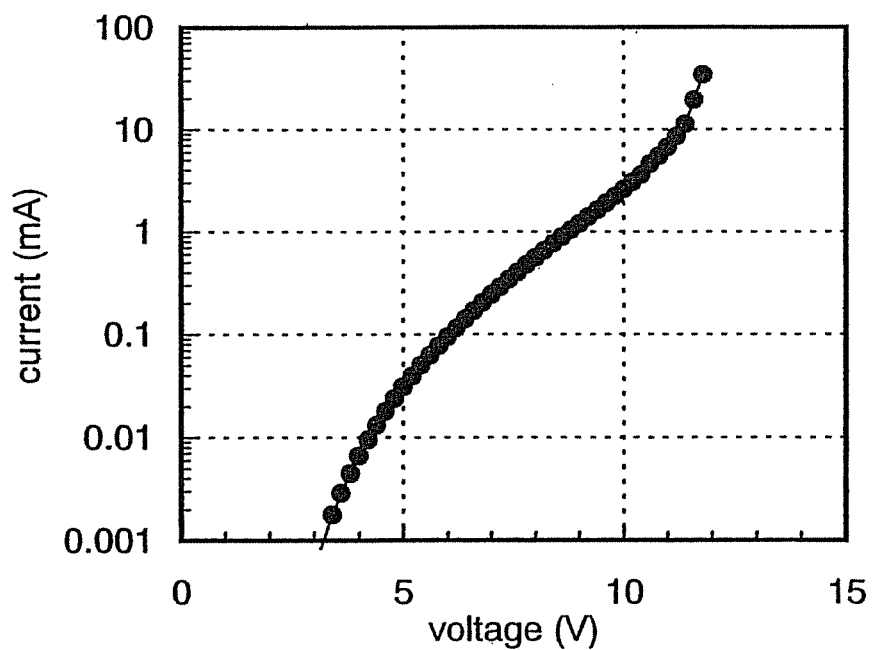
FIG. 15 is a graph showing a voltage-current curve of the element (green) as shown in FIG. 2B.
Figure 16:
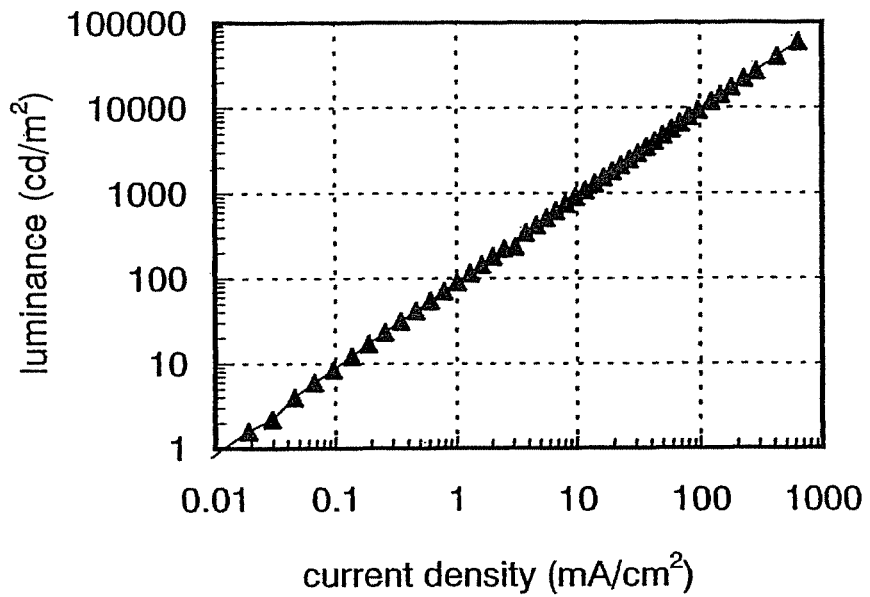
FIG. 16 is a graph showing a current density-luminance curve of an element (green) as shown in FIG. 3B.
Figure 17:
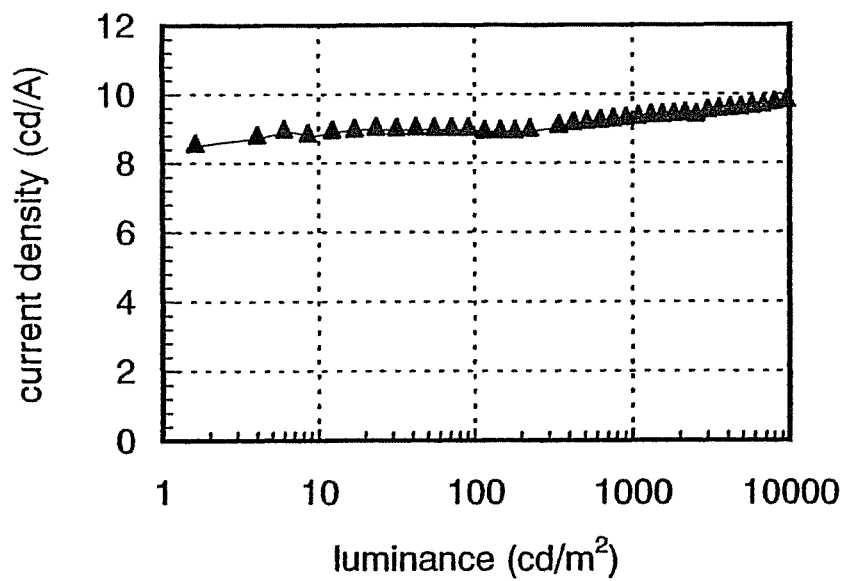
FIG. 17 is a graph showing a luminance-current efficiency curve of the element (green) as shown in FIG. 3B.
Figure 18:
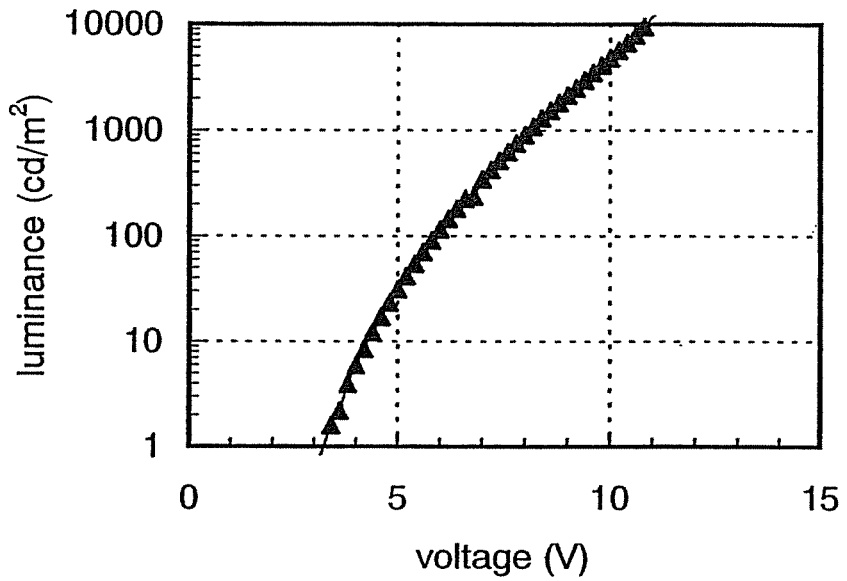
FIG. 18 is a graph showing a voltage-luminance curve of the element (green) as shown in FIG. 3B.
Figure 19:
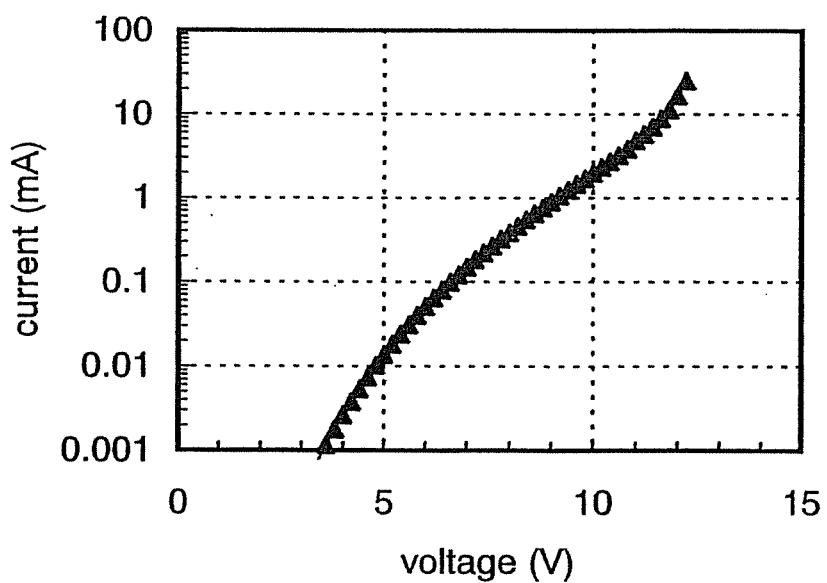
FIG. 19 is a graph showing a voltage-current curve of the element (green) as shown in FIG. 3B.
Figure 20:
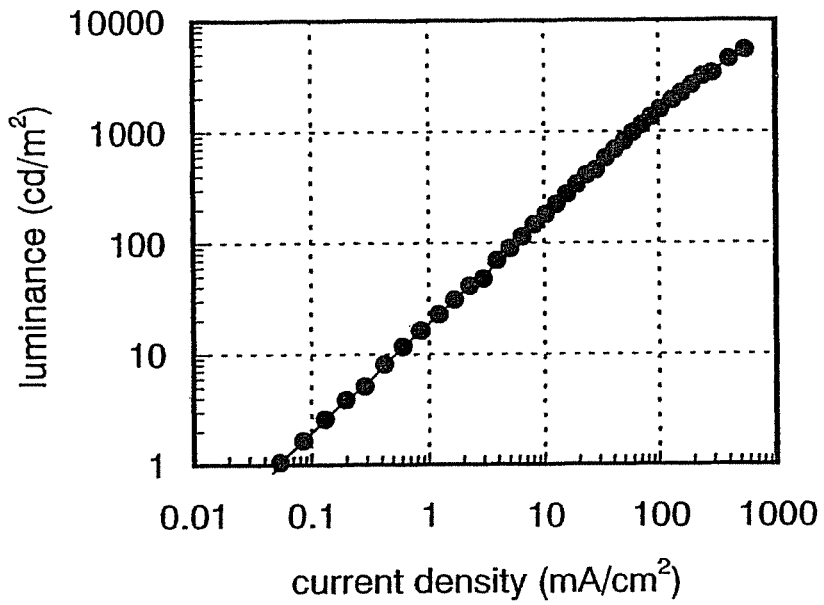
FIG. 20 is a graph showing a current density-luminance curve of an element (blue) as shown in FIG. 3B.
Figure 21:
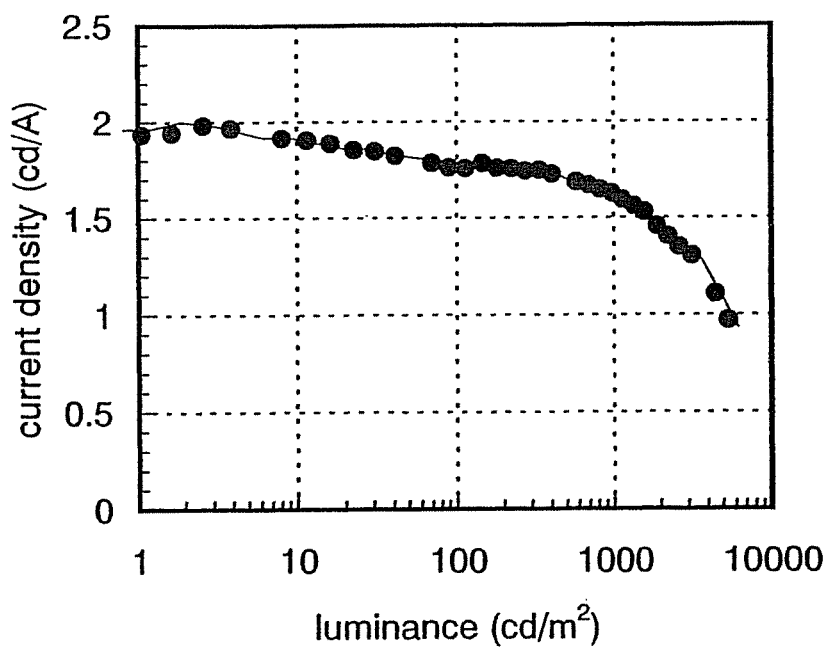
FIG. 21 is a graph showing a luminance-current efficiency curve of the element (blue) as shown in FIG. 3B.
Figure 22:
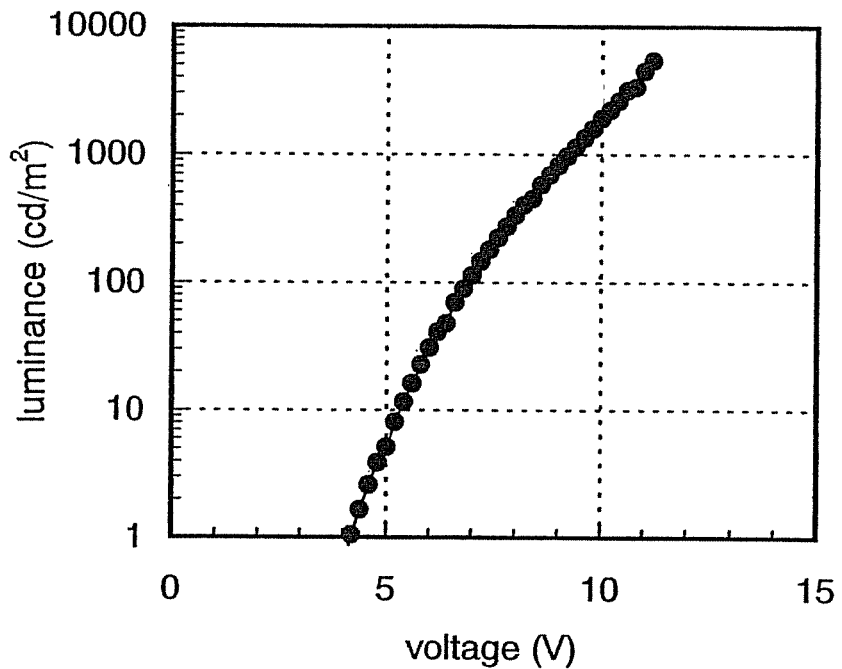
FIG. 22 is a graph showing a voltage-luminance curve of the element (blue) as shown in FIG. 3B.
Figure 23:
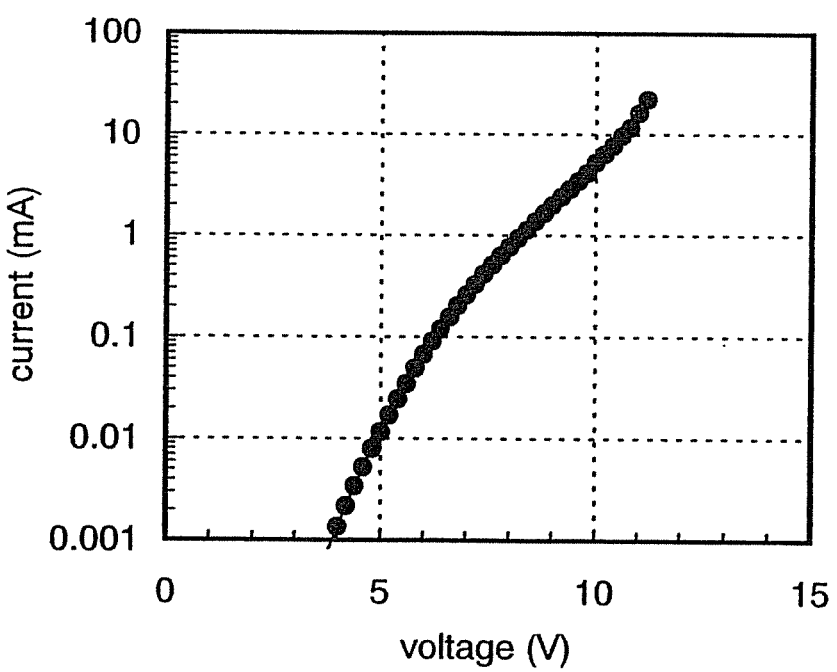
FIG. 23 is a graph showing a voltage-current curve of the element (blue) as shown in FIG. 3B.
Figure 24:
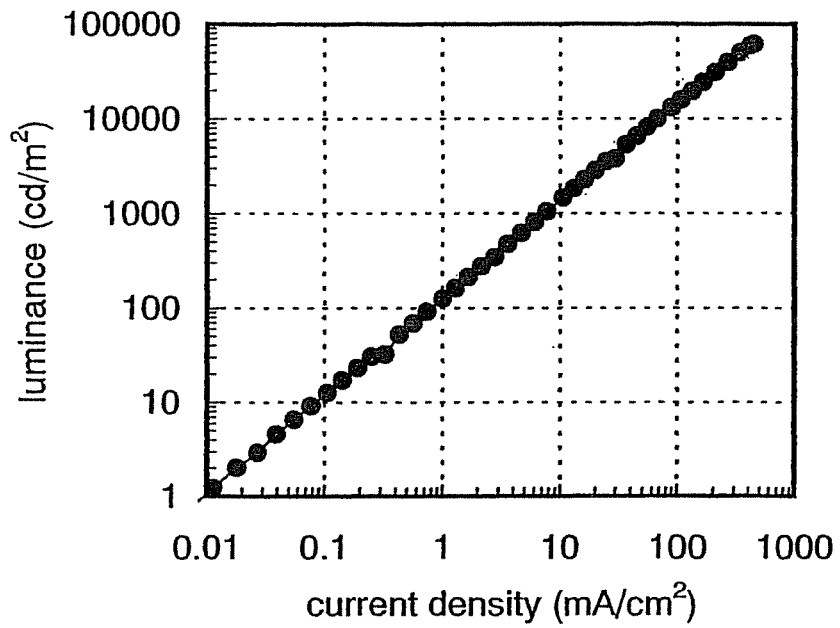
FIG. 24 is a graph showing a current density-luminance curve of an element (green) as shown in FIG. 1B.
Figure 25:
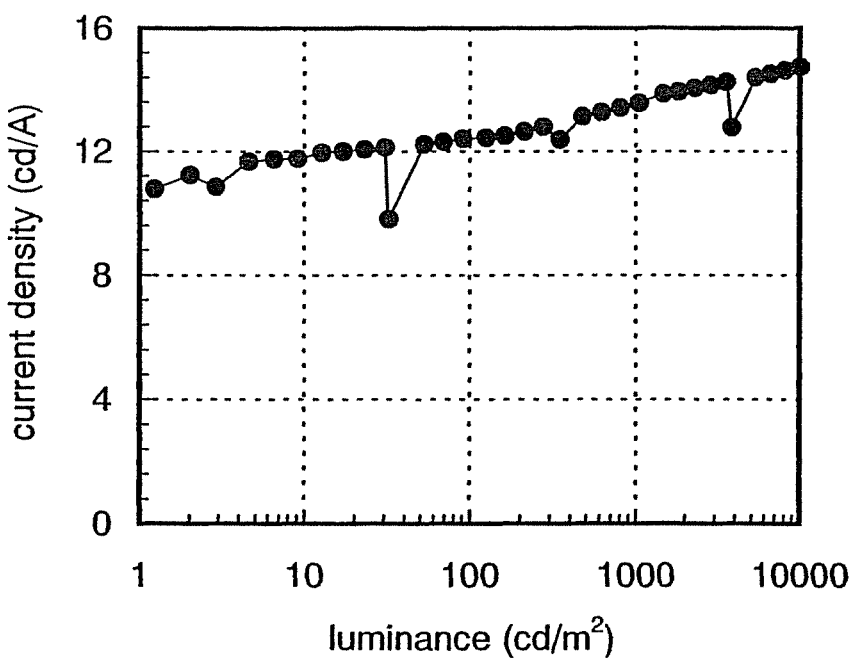
FIG. 25 is a graph showing a luminance-current efficiency curve of the element (green) as shown in FIG. 1B.
Figure 26:
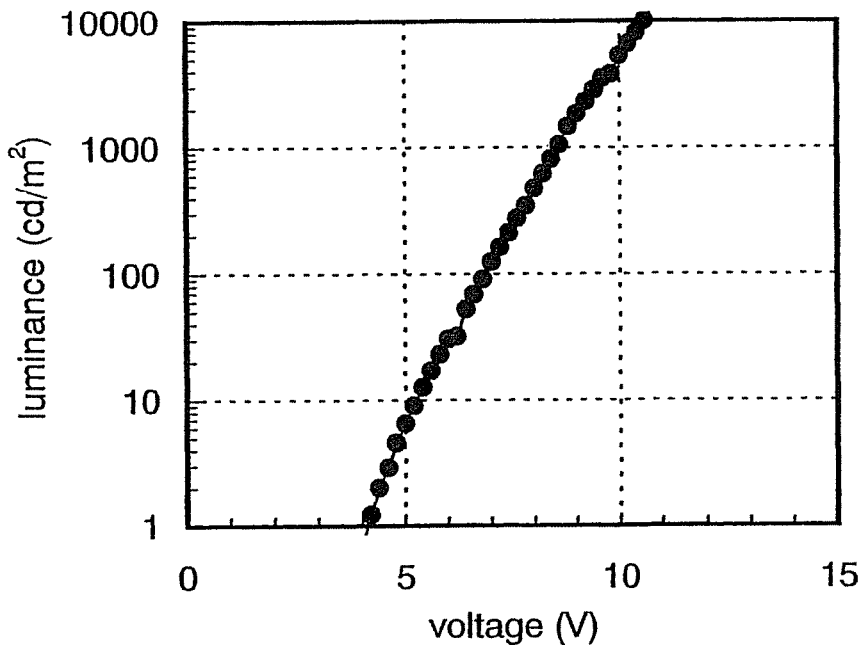
FIG. 26 is a graph showing a voltage-luminance curve of the element (green) as shown in FIG. 1B.
Figure 27:
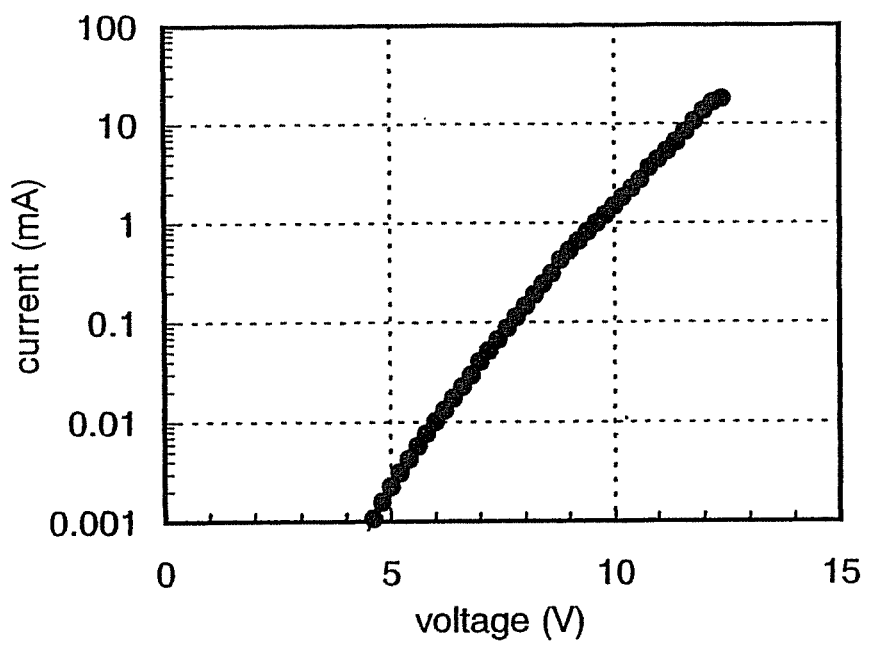
FIG. 27 is a graph showing a voltage-current curve of the element (green) as shown in FIG. 1B.

In FIG. 11, the switching TFT 1401 and the driving TFT 1403, the capacitor element 1402 and the light emitting element 1405 are provided in a pixel portion 1500. Diodes 1561 and 1562 are provided in the signal line 1410. The diodes 1561 and 1562 are manufactured according to the above described embodiment mode in the same manner as the switching TFT 1401 and the driving TFT 1403. The diodes comprise gate electrodes, semiconductor layers, source electrodes, drain electrodes and the like, respectively. By connecting the gate electrodes to the drain electrodes or the source electrodes, the diodes 1561 and 1562 are operated.

Common potential lines 1554 and 1555 connecting to the diodes are formed in the same layers as the gate electrodes. Therefore, it is necessary to form contact holes in a gate insulating layer so as to be in contact with the source electrodes or the drain electrodes of the diodes.

Diodes provided in the scanning line 1414 has the same structure.

Consequently, protection diodes can be simultaneously formed in an input stage according to the present invention. Further, the positions of the protection diodes is not limited to FIG. 11, and they can be provided between a driver circuit and a pixel.

In the display device of the present invention having such protection circuits, as an electrode of a light emitting element included in the display device, a material that is suitable for a structure of the light emitting element and a required performance can be used. Moreover, the reliability of the display device can be improved.

Embodiment 1

In this embodiment, the light emitting element as described in Embodiment Mode 2 (FIG. 2B) will be manufactured and measurement results thereof will be shown below. In this embodiment, a light emitting element that emits green light was manufactured.

A method for manufacturing the light emitting element of the present embodiment will be shown. The light emitting element of the present embodiment was formed over a glass substrate. As a second electrode, ITSO was formed with a thickness of 110 nm over the glass substrate. The ITSO was formed by sputtering. In the present invention, the shape of the second electrode was 2 mm×2 mm. Next, as a pretreatment for forming the light emitting element over the second electrode, the surface of the substrate was washed with porous resin (typically, PVA (polyvinyl alcohol), nylon or the like), and the substrate was subjected to a heat treatment at 200° C. for 1 hour. Thereafter, a UV ozone treatment was performed for 370 seconds.

Next, a layer having a donor level was formed with a thickness of 10 nm by co-evaporation of $Alq_3$ and lithium (the mass ratio was set to be 1:0.01). Subsequently, a layer having an acceptor level was formed with a thickness of 40 nm by co-evaporation of DNTPD and molybdenum (VI) oxide (the mass ratio was set to be 2:1). A hole transporting layer was formed with a thickness of 10 nm by α-NPD. A light emitting layer was formed with a thickness of 40 nm over the above laminated layers by co-evaporation of $Alq_3$ and coumarin 6 (the mass ratio was set to be 1:0.01). Also, an electron transporting layer was formed by $Alq_3$ to have a thickness of 10 nm. A layer having a donor level was formed with a thickness of 10 nm by co-evaporation of $Alq_3$ and lithium (the mass ratio was set to be 1:0.01). Afterwards, a first electrode was formed by aluminum to have a thickness of 200 nm. Thus, the light emitting element was completed. Further, the above layers and electrode were formed by vacuum evaporation using resistive heating with the exception of the second electrode.

The measurement results of current density-luminance characteristics, luminance-current efficiency characteristics, voltage-luminance characteristics and voltage-current characteristics with respect to the thus-manufactured light emitting element are shown in FIGS. 12 to 15. According to the measurement results, it is known that the light emitting element of the present invention is operated favorably. Furthermore, the CIE chromaticity coordinates at 1,000 cd/m² were x=0.31 and y=0.62. The light emitting element emitted favorable green light.

Embodiment 2

In this embodiment, the light emitting element as described in Embodiment Mode 3 (FIG. 3B) will be manufactured and measurement results thereof will be shown below. A light emitting element that emits green light was manufactured here.

A method for manufacturing the light emitting element of the present embodiment will be shown. The light emitting element of the present embodiment was formed over a glass substrate. As a second electrode, ITSO was formed over the glass substrate to have a thickness of 110 nm. The ITSO was formed by sputtering. Further, the shape of the second electrode was set to be 2 mm×2 mm. Next, as a pretreatment for forming the light emitting element on the second electrode, the surface of the substrate was washed with porous resin (typically, PVA (polyvinyl alcohol), nylon or the like), and the substrate was subjected to a heat treatment at 200° C. for 1 hour. Thereafter, an UV ozone treatment was performed for 370 seconds.

Next, a layer having a donor level was formed with a thickness of 10 nm by co-evaporation of $Alq_3$ and lithium (the mass ratio was set to be 1:0.01). Subsequently, a layer having an acceptor level was formed with a thickness of 40 nm by co-evaporation of DNTPD and molybdenum (VI) oxide (the mass ratio was set to be 4:2). A hole transporting layer was formed with a thickness of 10 nm by α-NPD. A light emitting layer was formed with a thickness of 40 nm over the above laminated layers by co-evaporation of $Alq_3$ and coumarin 6 (the mass ratio was set to be 1:0.01). Also, an electron transporting layer was formed by $Alq_3$ to have a thickness of 10 nm. A layer having a donor level was formed with a thickness of 10 nm by co-evaporation of $Alq_3$ and lithium (the mass ratio was set to be 1:0.01). A layer having an acceptor level was formed with a thickness of 20 nm by co-evaporation of DNTPD and molybdenum (VI) oxide (the mass separation was set to be 4:2). Afterwards, a first electrode was formed by aluminum to have a thickness of 200 nm. Thus, the light emitting element was completed. Further, the above layers and electrode were formed by vacuum evaporation using resistive heating with the exception of the second electrode.

The measurement results of current density-luminance characteristics, luminance-current efficiency characteristics, voltage-luminance characteristics and voltage-current characteristics with respect to the thus-manufactured light emitting element are shown in FIGS. 16 to 19. According to the measurement results, it is known that the light emitting element of the present invention is operated favorably. Further, the CIE chromaticity coordinates at 1,000 cd/m$^2$ were x=0.31 and y=0.62. The light emitting element emitted favorable green light.

Figure 28:
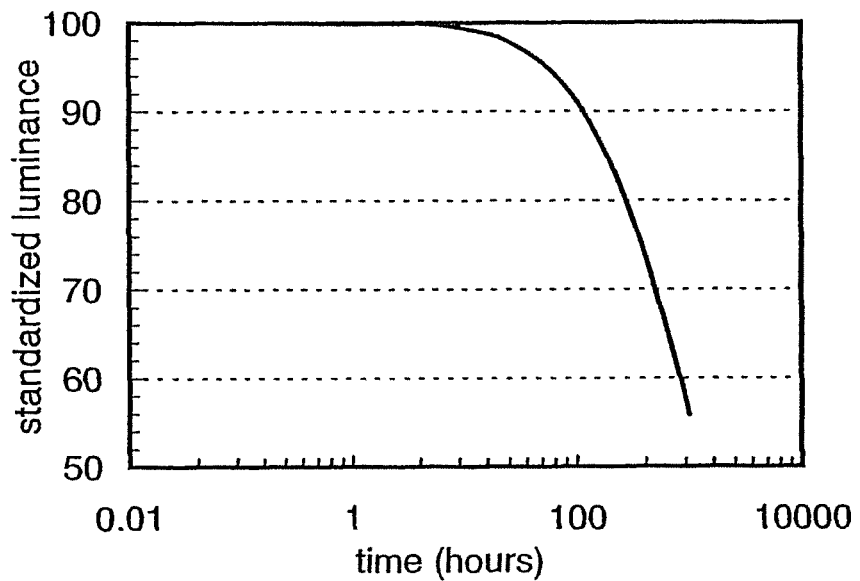
FIG. 28 is a graph showing a reliability of an element as shown in FIG. 3B.

Moreover, FIG. 28 is a graph showing the changes in luminance in the case where the initial luminance of the light emitting element was set to be 3,000 cd/m$^2$ and the light emitting element was driven at constant current density. This graph shows the initial luminance that is standardized as 100. The light emitting element of the present embodiment shows favorable characteristics, wherein at the initial luminance of 3,000 cd/m$^2$, it takes about 270 hours until the luminance is reduced by 20%.

Embodiment 3

In this embodiment mode, the light emitting element as described in Embodiment Mode 3 (FIG. 3B) will be manufactured and measurement results thereof will be shown below. In this embodiment mode, a light emitting element that emits blue light was manufactured.

A method for manufacturing the light emitting element of the present embodiment will be shown. The light emitting element of the present embodiment was formed over a glass substrate. As a second electrode, ITSO was formed over the glass substrate to have a thickness of 110 nm. The ITSO was formed by sputtering. Further, the shape of the second electrode was set to be 2 mm×2 mm. Next, as a pretreatment for forming the light emitting element over the second electrode, the surface of the substrate was washed with porous resin (typically, PVA (polyvinyl alcohol), nylon or the like), and the substrate was subjected to a heat treatment at 200° C. for 1 hour. Thereafter, an UV ozone treatment was performed for 370 seconds.

Next, a layer having a donor level was formed with a thickness of 10 nm by co-evaporation of $Alq_3$ and lithium (the mass ratio was set to be 1:0.01). Subsequently, a layer having an acceptor level was formed with a thickness of 40 nm by co-evaporation of DNTPD and molybdenum (VI) oxide (the mass ratio was set to be 4:2). A hole transporting layer was formed with a thickness of 10 nm by α-NPD. A light emitting layer was formed using t-BuDNA over the above laminated layers to have a thickness of 40 nm. Also, an electron transporting layer was formed by $Alq_3$ to have a thickness of 10 nm. A layer having a donor level was formed with a thickness of 10 nm by co-evaporation of $Alq_3$ and lithium (the mass ratio was set to be 1:0.01). Subsequently, a layer having an acceptor level was formed by co-evaporation of DNTPD and molybdenum (VI) oxide (the mass ratio was set to be 4:2) to have a thickness of 20 nm. Afterwards, a first electrode was formed by aluminum to have a thickness of 200 nm. Thus, the light emitting element was completed. Further, the above layers and electrode were formed by vacuum evaporation using resistive heating with the exception of the second electrode.

The measurement results of current density-luminance characteristics, luminance-current efficiency characteristics, voltage-luminance characteristics and voltage-current characteristics with respect to the thus-manufactured light emitting element are shown in FIGS. 20 to 23. According to the measurement results, it is known that the light emitting element of the present invention is operated favorably. Further, the CIE chromaticity coordinates at 1,000 cd/m$^2$ were x=0.16 and y=0.13. The light emitting element emitted blue light favorably.

Embodiment 4

In this embodiment, the light emitting element as described in Embodiment Mode 1 (FIG. 1B) will be manufactured and measurement results thereof will be shown below. In this embodiment, a light emitting element that emits green light was manufactured.

A method for manufacturing the light emitting element of the present embodiment will be shown. The light emitting element of the present embodiment was formed over a glass substrate. As a second electrode, ITSO was formed over the glass substrate to have a thickness of 110 nm. The ITSO was formed by sputtering. Further, the shape of the second electrode was set to be 2 mm×2 mm. Next, as a pretreatment for forming the light emitting element on the second electrode, the surface of the substrate was washed with porous resin (typically, PVA (polyvinyl alcohol), nylon or the like), and the substrate was subjected to a heat treatment at 200° C. for 1 hour. Thereafter, an UV ozone treatment was performed for 370 seconds.

Next, a layer having a donor level was formed with a thickness of 10 nm by co-evaporation of $Alq_3$ and lithium (the mass ratio was set to be 1:0.01). Subsequently, a layer having an acceptor level was formed with a thickness of 40 nm by co-evaporation of DNTPD and molybdenum (VI) oxide (the mass ratio was set to be 4:2). A hole transporting layer was formed with a thickness of 10 nm by α-NPD. A light emitting layer was formed by co-evaporation of $Alq_3$ and coumarin 6 on the above laminated layers to have a thickness of 40 nm. Also, an electron transporting layer was formed by $Alq_3$ to have a thickness of 40 nm. Afterwards, as a first electrode, lithium fluoride was formed to have a thickness of 10 nm and aluminum was laminated thereon to have a thickness of 200 nm. Thus, the light emitting element was completed. Further, the above layers and electrode were formed by vacuum evaporation using resistive heating with the exception of the first electrode.

The measurement results of current density-luminance characteristics, luminance-current efficiency characteristics, voltage-luminance characteristics and voltage-current characteristics with respect to the thus-manufactured light emitting element are shown in FIGS. 24 to 27. According to the measurement results, it is known that the light emitting element of the present invention is operated favorably. Further, the CIE chromaticity coordinates at 1,000 cd/m$^2$ were x=0.29 and y=0.64. The light emitting element emitted green light favorably.

Figure 29:
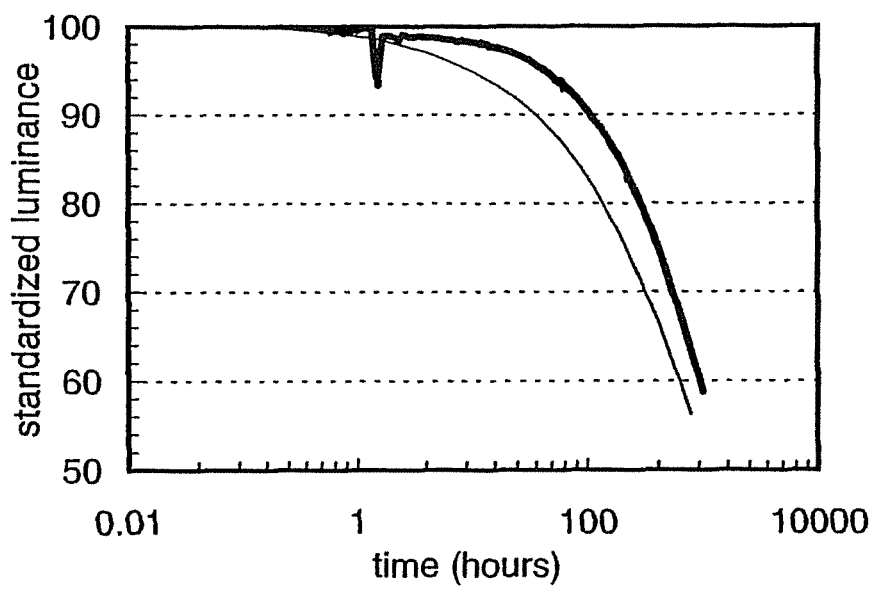
FIG. 29 is a graph showing a reliability of an element as shown in FIG. 1B.

Moreover, FIG. 29 is a graph showing the changes in luminance in the case where the initial luminance of the light emitting element was set to be 3,000 cd/m$^2$ and the light emitting element was driven at constant current density. This graph shows the initial luminance that is standardized as 100. According to this graph, the light emitting element of the present embodiment shows favorable characteristics, wherein at the initial luminance 3,000 cd/m$^2$, it takes about 280 hours until the luminance is reduced by 20%.

Moreover, characteristics of an element that has almost similar structure to the element of Embodiment Mode 1 except that the layer having the donor level is not formed on the first electrode, are also shown in FIG. 29 with a thin line as a comparative example. Further, the element of the comparative example was manufactured as follows.

The element of the comparative example was formed in the same manner as the Embodiment 4 until forming the second electrode, and is not described here. After forming the second electrode in the same manner as Embodiment 4, a layer having an acceptor level was formed with a thickness of 50 nm by co-evaporation of DNTPD and molybdenum (VI) oxide (the mass ratio was set to be 2:1). A hole transporting layer was formed with a thickness of 10 nm by α-NPD. A light emitting layer was formed by co-evaporation of Alq$_3$ and coumarin 6 (the mass ratio was set to be 1:0.01) over the above laminated layers to have a thickness of 40 nm. Also, an electron transporting layer was formed by Alq$_3$ to have a thickness of 40 nm. Afterwards, as a first electrode, lithium fluoride was formed with a thickness of 10 nm and aluminum was laminated thereon with a thickness of 200 nm. Thus, the element of the comparative example was completed. Further, the above layers and electrode were formed by vacuum evaporation using resistive heating with the exception of the second electrode.

When the initial luminance of the element of the comparative example was set to be 3,000 cd/m$^2$ and the element was driven at constant current density, it took about 140 hours until the luminance was reduced by 20%. As a result, the light emitting element of the present embodiment can obtain reliability that is two times higher than the element of the comparative example. It is thought that this is because the deterioration of the luminance immediately after driving the light emitting element of the present embodiment is more suppressed as compared with the element of the comparative example. Consequently, the deterioration in luminance immediately after driving the light emitting element can be reduced in the light emitting element of the present embodiment.

The invention claimed is:

1. A light emitting device comprising:
a first electrode;
a first layer having a donor level in direct contact with the first electrode;
a laminated body including a layer containing a light emitting substance in direct contact with the first layer;
a second layer having an acceptor level in direct contact with the laminated body;
a third layer having a donor level in direct contact with the second layer; and
a second electrode in direct contact with the third layer,
wherein each of the first layer and the third layer comprises both a material with an electron transporting property and a material with an electron donating property, and
wherein the second layer comprises both a material with a hole transporting property and a material with an electron accepting property.

2. The light emitting device according to claim 1, wherein the material with the electron transporting property is selected from tris(8-quinolinolato)aluminum (abbreviation: Alq$_3$), bathophenanthroline (abbreviation: BPhen) and bathocuproin (abbreviation: BCP).

3. The light emitting device according to claim 1, wherein the second layer comprises metal oxide.

4. The light emitting device according to claim 3, wherein the metal oxide is selected from molybdenum oxide, vanadium oxide, ruthenium oxide, cobalt oxide, nickel oxide, and copper oxide.

5. The light emitting device according to claim 1, wherein the laminated body has a single layer structure.

6. A light emitting device comprising;
a first electrode,
a fourth layer having an acceptor level in direct contact with the first electrode,
a first layer having a donor level in direct contact with the fourth layer;
a laminated body including a layer containing a light emitting substance in direct contact with the first layer;
a second layer having an acceptor level in direct contact with the laminated body;
a third layer having a donor level in direct contact with the second layer; and
a second electrode in contact with the third layer,
wherein each of the first layer and the third layer comprises both a material with an electron transporting property and a material with an electron donating property, and
wherein each of the second layer and the fourth layer comprises both a material with a hole transporting property and a material with an electron accepting property.

7. The light emitting device according to claim 6, wherein the material with the electron transporting property is selected from tris(8-quinolinolato)aluminum (abbreviation: Alq$_3$), bathophenanthroline (abbreviation: BPhen) and bathocuproin (abbreviation: BCP).

8. The light emitting device according to claim 6, wherein at least one of the second layer and the fourth layer comprises a metal oxide.

9. The light emitting device according to claim 8, wherein the metal oxide is selected from molybdenum oxide, vanadium oxide, ruthenium oxide, cobalt oxide, nickel oxide, and copper oxide.

10. The light emitting device according to claim 6, wherein the laminated body has a single layer structure.

11. A light emitting device comprising:
a first electrode;
a first layer containing a first substance of which an electron mobility is higher than a hole mobility and a second substance that donate an electron to the first substance in direct contact with the first electrode;
a laminated body including a layer containing a light emitting substance in direct contact with the first layer;
a second layer containing a third substance of which a hole mobility is higher than an electron mobility and a fourth substance that accept an electron from the third substance in direct contact with the laminated body;
a third layer containing a fifth substance of which an electron mobility is higher than a hole mobility and a sixth substance that donate an electron to the fifth substance in direct contact with the second layer; and
a second electrode in direct contact with the third layer.

12. The light emitting device according to claim 11, wherein each of the first substance and the fifth substance is a material with an electron transporting property.

13. The light emitting device according to claim 12, wherein the material is selected from tris(8-quinolinolato) aluminum (abbreviation: Alq$_3$), bathophenanthroline (abbreviation: BPhen) and bathocuproin (abbreviation: BCP).

14. The light emitting device according to claim 11, wherein the fourth substance is metal oxide.

15. The light emitting device according to claim 14, wherein the metal oxide is selected from molybdenum oxide, vanadium oxide, ruthenium oxide, cobalt oxide, nickel oxide, and copper oxide.

16. The light emitting device according to claim 11, wherein the laminated body has a single layer structure.

17. A light emitting device comprising;
a first electrode;
a fourth layer containing a seventh substance of which a hole mobility is higher than an electron mobility and an eighth substance that accept an electron from the seventh substance in direct contact with the first electrode;
a first layer containing a first substance of which an electron mobility is higher than a hole mobility and a second substance that donate an electron to the first substance in direct contact with the fourth layer;
a laminated body including a layer containing a light emitting substance in direct contact with the first layer;
a second layer containing a third substance of which a hole mobility is higher than an electron mobility and a fourth substance that accept an electron from the third substance in direct contact with the laminated body;
a third layer containing a fifth substance of which an electron mobility is higher than a hole mobility and a sixth substance that donate an electron to the fifth substance in direct contact with the second layer; and
a second electrode in direct contact with the third layer.

18. The light emitting device according to claim 17, wherein each of the first substance and the fifth substance is a material with an electron transporting property.

19. The light emitting device according to claim 18, wherein the material is selected from tris(8-quinolinolato) aluminum (abbreviation: Alq$_3$), bathophenanthroline (abbreviation: BPhen) and bathocuproin (abbreviation: BCP).

20. The light emitting device according to claim 17, wherein at least one of the fourth substance and the eighth substance is metal oxide.

21. The light emitting device according to claim 20, wherein the metal oxide is selected from molybdenum oxide, vanadium oxide, ruthenium oxide, cobalt oxide, nickel oxide, and copper oxide.

22. The light emitting device according to claim 17, wherein the laminated body has a single layer structure.

* * * * *